(12) United States Patent
Song et al.

(10) Patent No.: US 12,080,749 B2
(45) Date of Patent: Sep. 3, 2024

(54) PIXEL AND DISPLAY DEVICE HAVING THE SAME

(71) Applicant: Samsung Display Co., Ltd., Yongin-si (KR)

(72) Inventors: Myeong Hun Song, Yongin-si (KR); Sung Geun Bae, Yongin-si (KR); Sung Jin Lee, Yongin-si (KR); Jong Chan Lee, Yongin-si (KR); Tae Hee Lee, Yongin-si (KR); Kyung Ah Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 457 days.

(21) Appl. No.: 17/347,222

(22) Filed: Jun. 14, 2021

(65) Prior Publication Data
US 2022/0059609 A1 Feb. 24, 2022

(30) Foreign Application Priority Data
Aug. 21, 2020 (KR) .......................... 10-2020-0105607

(51) Int. Cl.
*H01L 27/15* (2006.01)
*H01L 33/38* (2010.01)

(52) U.S. Cl.
CPC .......... *H01L 27/156* (2013.01); *H01L 33/387* (2013.01)

(58) Field of Classification Search
None
See application file for complete search history.

(56) References Cited

U.S. PATENT DOCUMENTS

| 10,658,605 | B2 | 5/2020 | Lee et al. |
| 2008/0179602 | A1 | 7/2008 | Negley et al. |
| 2022/0069003 | A1* | 3/2022 | Lee ...................... H01L 33/387 |

FOREIGN PATENT DOCUMENTS

| KR | 10-2019-0029831 A | 3/2019 |
| WO | WO 2020/145461 A1 | 7/2020 |

OTHER PUBLICATIONS

Extended European Search Report dated Jan. 18, 2022 for corresponding European Application No. 21192445.1 (11 pages).

* cited by examiner

*Primary Examiner* — Robert K Carpenter
(74) *Attorney, Agent, or Firm* — Lewis Roca Rothgerber Christie LLP

(57) ABSTRACT

A pixel may include a substrate, a dummy insulating pattern on the substrate, a first electrode on the substrate and including a (1-1)th electrode and a (1-2)th electrode that are spaced from each other and aligned with each other along a first direction, a second electrode spaced from the first electrode in a second direction different from the first direction, and including a (2-1)th electrode and a (2-2)th electrode that are spaced from each other and aligned with each other along the first direction, a plurality of light emitting elements electrically connected to the first electrode and the second electrode and emitting light, and a first insulating layer on each of the light emitting elements. Here, the dummy insulating pattern may be connected to one end of at least one of the (1-1)th electrode and the (1-2)th electrode that are aligned with each other along the first direction.

20 Claims, 24 Drawing Sheets

PIXEL AND DISPLAY DEVICE HAVING THE SAME

CROSS-REFERENCE TO RELATED APPLICATION

This application claims priority to and the benefit of Korean Patent Application No. 10-2020-0105607, filed in the Korean Intellectual Property Office on Aug. 21, 2020, the content of which in its entirety is herein incorporated by reference.

BACKGROUND

1. Field

The disclosure relates to a pixel and a display device including the same.

2. Description of the Related Art

As interest in information displays is increasing and a demand for using portable information media is increasing, a focus is being made on a demand and commercialization for a display devices.

SUMMARY

An aspect of the disclosure is to provide a pixel capable of preventing or reducing deviation or misalignment of light emitting elements by forming a dummy pattern in a first opening of each pixel area to fix some light emitting elements remaining in the first opening.

In an embodiment, a display device having the above-described pixel is provided.

A pixel according to an embodiment of the disclosure may include a substrate, a dummy insulating pattern on the substrate, a first electrode on the substrate and including a (1-1)th electrode and a (1-2)th electrode that are spaced from each other and aligned with each other along a first direction, a second electrode spaced from the first electrode in a second direction different from the first direction, and including a (2-1)th electrode and a (2-2)th electrode that are spaced from each other and aligned with each other along the first direction, a plurality of light emitting elements electrically connected to the first electrode and the second electrode and emitting light, and a first insulating layer on each of the light emitting elements. Here, the dummy insulating pattern may be connected to one end of at least one of the (1-1)th electrode and the (1-2)th electrode that are aligned with each other along the first direction or may be located between the (1-1)th electrode and the (1-2)th electrode.

In an embodiment, the dummy insulating pattern and the first insulating layer may be located at a same layer and may include a same material.

In an embodiment, the plurality of light emitting elements may include at least one first light emitting element between the (1-1)th electrode and the (2-1)th electrode, at least one second light emitting element between the (1-2)th electrode and the (2-2)th electrode, and at least one ineffective light source between the (1-1)th electrode and the (1-2)th electrode that are aligned with each other along the first direction.

In an embodiment, the first insulating layer may be on each of the at least one first light emitting element and the at least one second light emitting element, and the dummy insulating pattern may be on the at least one ineffective light source.

In an embodiment, the dummy insulating pattern may include a first dummy insulating pattern extending from the first insulating layer on the at least one first light emitting element to one end of the (1-1)th electrode, and a second dummy insulating pattern extending from the first insulating layer on the at least one second light emitting element to one end of the (1-2)th electrode. Here, the first dummy insulating pattern and the second dummy insulating pattern may be spaced from each other.

In an embodiment, the dummy insulating pattern may include a first dummy insulating pattern spaced from the first insulating layer on the at least one first light emitting element and positioned between the (1-1)th electrode and the (1-2)th electrode, and a second dummy insulating pattern spaced from the first insulating layer on the at least one second light emitting element and positioned between the (1-1)th electrode and (1-2)th electrode.

In an embodiment, the pixel may include a dummy conductive pattern between the (1-1)th electrode and the (1-2)th electrode that are aligned with each other along the first direction. Here, the dummy insulating pattern may be on the dummy conductive pattern.

In an embodiment, the dummy insulating pattern and the dummy conductive pattern may have a same planar shape.

In an embodiment, the dummy conductive pattern may include a first dummy conductive pattern connected to one end of the (1-1)th electrode, and a second dummy conductive pattern connected to one end of the (1-2)th electrode. Here, the first dummy conductive pattern and the second dummy conductive pattern may be spaced from each other.

In an embodiment, the dummy conductive pattern may be spaced from each of one end of the (1-1)th electrode and one end of the (1-2)th electrode.

In an embodiment, the dummy insulating pattern may include a plurality of first dummy insulating patterns extending in the first direction, and a plurality of second dummy insulating patterns extending in the second direction different from the first direction.

In an embodiment, the first dummy insulating patterns and the second dummy insulating patterns may be connected to each other. Here, the dummy insulating pattern may further include a plurality of cavities at a crossing between the first dummy insulating patterns and the second dummy insulating patterns. The dummy insulating pattern may include a mesh structure.

In an embodiment, the pixel may further include a third electrode spaced from the second electrode in the second direction and including a (3-1)th electrode and a (3-2)th electrode that are spaced from each other and aligned with each other along the first direction, and a fourth electrode spaced from the third electrode in the second direction and including a (4-1)th electrode and a (4-2)th electrode that are spaced from each other and aligned with each other along the first direction.

In an embodiment, the plurality of light emitting elements may include at least one third light emitting element positioned between the (3-2)th electrode and the (4-2)th electrode, and at least one fourth light emitting element positioned between the (3-1)th electrode and the (4-1)th electrode. Here, the first insulating layer may be on each of the at least one third light emitting element and the at least one fourth light emitting element.

In an embodiment, the pixel may further include a second insulating layer on the (1-1)th to (4-1)th electrodes and the (1-2)th to (4-2)th electrodes, a first contact electrode on the (1-1)th electrode and electrically connected to the (1-1)th electrode through a first via hole of the second insulating layer, a second contact electrode on the (3-1)th electrode and electrically connected to the (3-1)th electrode through a second via hole of the second insulating layer, a first intermediate electrode on the (2-1)th electrode and the (1-2)th electrode, a second intermediate electrode on the (2-2)th electrode and the (4-2)th electrode, and a third intermediate electrode on the (3-2)th electrode and the (4-1)th electrode.

In an embodiment, the first intermediate electrode, the second intermediate electrode, and the third intermediate electrode may be at a same layer as the first and second contact electrodes. Here, the first intermediate electrode, the second intermediate electrode, and the third intermediate electrode may be spaced from each other.

A display device according to an embodiment of the disclosure may include a substrate including a plurality of pixel areas, and a pixel located in each of the pixel areas.

In an embodiment, the pixel may include first and second dummy insulating patterns on the substrate, a first electrode on the substrate and including a (1-1)th electrode and a (1-2)th electrode that are spaced from each other and aligned with each other along a first direction, a second electrode spaced from the first electrode in a second direction different from the first direction, and including a (2-1)th electrode and a (2-2)th electrode that are spaced from each other and aligned with each other along the first direction, a third electrode spaced from the second electrode in the second direction and including a (3-1)th electrode and a (3-2)th electrode that are spaced from each other and aligned with each other along the first direction, a fourth electrode spaced from the third electrode in the second direction and including a (4-1)th electrode and a (4-2)th electrode that are spaced from each other and aligned with each other along the first direction, a plurality of light emitting elements between adjacent two electrodes from among the first to fourth electrodes, and an insulating layer on one surface of each of the light emitting elements. Here, the first dummy insulating pattern may be connected to one end of at least one of the (1-1)th electrode and the (1-2)th electrode that are aligned with each other along the first direction or may be located between the (1-1)th electrode and the (1-2)th electrode. In addition, the second dummy insulating pattern may be connected to one end of at least one of the (4-1)th electrode and the (4-2)th electrode that rea aligned with each other along the first direction or may be located between the (1-1)th electrode and the (1-2)th electrode.

The pixel according to an embodiment of the disclosure and the display device including the same form a dummy pattern in a first opening of each pixel area to fix some light emitting elements remaining in the first opening with the dummy pattern. Therefore, the pixel according to an embodiment of the disclosure and the display device including the same may prevent a defect due to the light emitting elements by preventing deviation of the light emitting elements.

An aspect of an embodiment of the disclosure is not limited to the contents illustrated above, and more various effects are included in the present disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
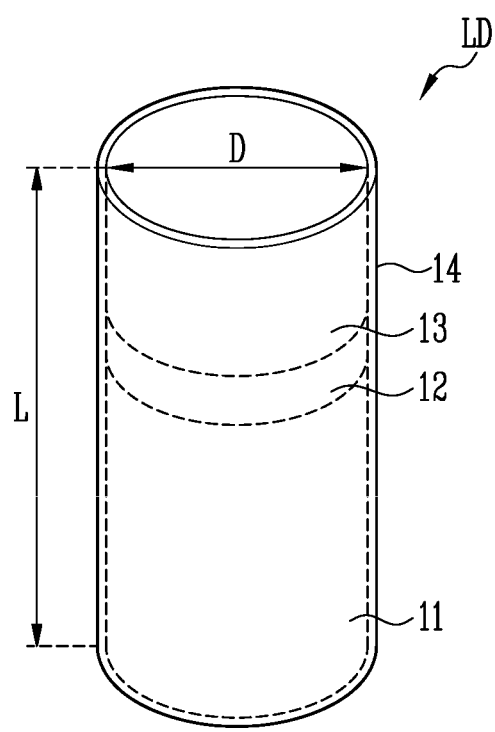
FIG. 1 is a perspective view schematically illustrating a light emitting element according to an embodiment of the disclosure.

The disclosure may be modified in various manners and have various forms. Therefore, specific embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In a case where a portion of a layer, a film, an area, a plate, or the like is referred to as being "on" another portion, it includes not only a case where the portion is "directly on" another portion, but also a case where there is further another portion between the portion and another portion. In the present disclosure, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. In one or more embodiments of the present disclosure, a phrase "formed and/or located in (or at) the same layer" may mean that they are formed in the same process and are formed of the same material.

In the present application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') is not present between the component and the other component.

Hereinafter, embodiments of the disclosure and others necessary details for those skilled in the art to understand the disclosure will be described in detail with reference to the accompanying drawings. In the following description, the singular expressions include plural expressions unless the context clearly dictates otherwise.

Figure 2:
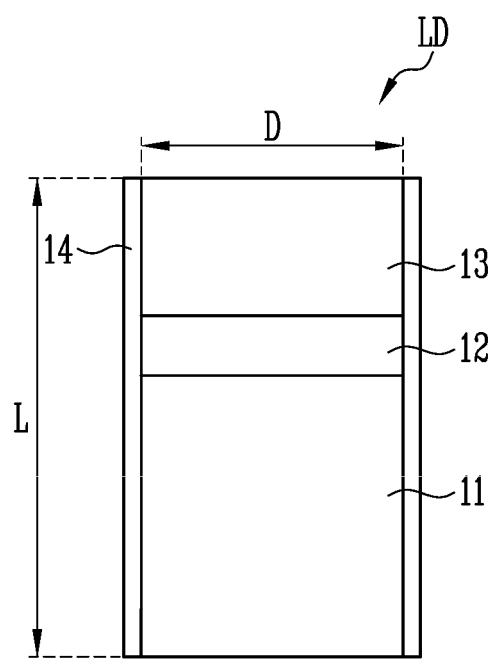
FIG. 2 is a cross-sectional view of the light emitting element of FIG. 1.

FIG. 1 is a perspective view schematically illustrating a light emitting element according to an embodiment of the disclosure, and FIG. 2 is a cross-sectional view of the light emitting element of FIG. 1.

In an embodiment of the disclosure, a type and/or a shape of the light emitting element are/is not limited to the embodiment shown in FIGS. 1 and 2.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may implement a light emitting stack in which the first semiconductor layer 11, the active layer 12, and the second semiconductor layer 13 are sequentially stacked.

The light emitting element LD may be provided in a shape extending in one direction. When an extension direction of the light emitting element LD is referred to as a longitudinal direction, the light emitting element LD may include one end (or a lower end) and another end (or an upper end) along the extension direction. Any one of the first and second semiconductor layers 11 and 13 may be disposed at the one end (or the lower end) of the light emitting element LD, and the other one of the first and second semiconductor layers 11 and 13 may be disposed at the other end (or the upper end) of the light emitting element LD. For example, the first semiconductor layer 11 may be disposed at the one end (or the lower end) of the light emitting element LD, and the second semiconductor layer 13 may be disposed at the other end (or the upper end) of the light emitting element LD.

The light emitting element LD may be provided in various shapes. For example, the light emitting element LD may have a rod-like shape or a bar-like shape that is long in the longitudinal direction (i.e., an aspect ratio is greater than 1). In an embodiment of the disclosure, a length L of the light emitting element LD in the longitudinal direction may be greater than a diameter D (or a width of a cross section) of the light emitting element LD. The light emitting element LD may include, for example, a light emitting diode (LED) manufactured to be small enough to have the diameter D and/or the length L of about a nano scale to a micro scale. For example, the LED may have extremely small dimensions.

The diameter D of the light emitting element LD may be 0.5 μm to 500 μm, and the length L may be about 1 μm to 10 μm. However, the diameter D and the length L of the light emitting element LD is not limited thereto. A size of the light emitting element LD may be changed to satisfy a requirement condition (or a design condition) of a lighting device or a light emitting display device to which the light emitting element LD is applied.

For example, the first semiconductor layer 11 may include at least one n-type semiconductor layer. For example, the first semiconductor layer 11 may include any one semiconductor material from among InAlGaN, GaN, AlGaN, InGaN, AlN, and InN, and may be an n-type semiconductor layer doped with a first conductive dopant (or an n-type dopant) such as Si, Ge, or Sn. However, the material configuring the first semiconductor layer 11 is not limited thereto, and other various materials may configure the first semiconductor layer 11. In an embodiment of the disclosure, the first semiconductor layer 11 may include a gallium nitride (GaN) semiconductor material doped with the first conductive dopant (or the n-type dopant). The first semiconductor layer 11 may include an upper surface contacting the active layer 12 along a direction of the length L of the light emitting element LD and a lower surface exposed to the outside. The lower surface of the first semiconductor layer 11 may be the one end (or the lower end) of the light emitting element LD.

The active layer 12 may be disposed on the first semiconductor layer 11 and may be formed in a single quantum well structure or a multiple quantum wells structure. For example, when the active layer 12 is formed in the multiple quantum wells structure, in the active layer 12, a barrier layer, a strain reinforcing layer, and a well layer may be periodically and repeatedly stacked as one unit. The strain reinforcing layer may have a lattice constant less than that of the barrier layer to further a reinforce strain, for example, a compression strain, applied to the well layer. However, a structure of the active layer 12 is not limited to the above-described embodiment.

The active layer 12 may emit light of a wavelength of 400 nm to 900 nm, and may use a double hetero structure. In an embodiment of the disclosure, a clad layer doped with a conductive dopant may be formed on and/or under the active layer 12 along the direction of the length L of the light emitting element LD. For example, the clad layer may be formed of an AlGaN layer or an InAlGaN layer. According to an embodiment, a material such as AlGaN or InAlGaN may be used to form the active layer 12. In an embodiment, other various materials may configure the active layer 12. The active layer 12 may include a first surface contacting the first semiconductor layer 11 and a second surface contacting the second semiconductor layer 13.

When an electric field of a voltage (e.g., a set or predetermined voltage) or more is applied between both ends of the light emitting element LD, the light emitting element LD emits light while an electron-hole pair is combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material from among InAlGaN, GaN, AlGaN, InGaN, AlN, and InN, and may include a p-type semiconductor layer doped with a second conductive dopant (or a p-type dopant) such as Mg. However, the material configuring the second semiconductor layer 13 is not limited thereto, and other various materials may configure the second semiconductor layer 13. In an embodiment of the disclosure, the second semiconductor layer 13 may include a gallium nitride (GaN) semiconductor material doped with the second conductive dopant (or the p-type dopant). The second semiconductor layer 13 may include a lower surface contacting the second surface of the active layer 12 along the direction of the length L of the light emitting element LD and an upper surface exposed to the outside. Here, the upper surface of the second semiconductor layer 13 may be the other end (or the upper end) of the light emitting element LD.

In an embodiment of the disclosure, the first semiconductor layer 11 and the second semiconductor layer 13 may have thicknesses different from each other in the direction of the length L of the light emitting element LD. For example, the first semiconductor layer 11 may have a thickness relatively thicker than that of the second semiconductor layer 13 along the direction of the length L of the light emitting element LD. Therefore, the active layer 12 of the light emitting element LD may be positioned more adjacently to the upper surface of the second semiconductor layer 13 than to the lower surface of the first semiconductor layer 11.

Although the first semiconductor layer 11 and the second semiconductor layer 13 are shown as being configured of one layer, the disclosure is not limited thereto. In an embodiment of the disclosure, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer to reduce a difference of a lattice constant. The TSBR layer may be configured of a p-type semiconductor layer such as p-GaInP, p-AlInP, and p-AlGaInP, but the disclosure is not limited thereto.

According to an embodiment, the light emitting element LD may further include an additional electrode (hereinafter referred to as a 'first additional electrode') disposed on the second semiconductor layer 13 in addition to the above-described first semiconductor layer 11, active layer 12, and second semiconductor layer 13. According to another embodiment, the light emitting element LD may further include another additional electrode (hereinafter referred to as a 'second additional electrode') disposed at one end of the first semiconductor layer 11.

Each of the first and second additional electrodes may be an ohmic contact electrode, but the disclosure is not limited thereto. According to an embodiment, the first and second additional electrodes may be Schottky contact electrodes. The first and second additional electrodes may include a conductive material (or substance). For example, the first and second additional electrodes may include an opaque metal using chromium (Cr), titanium (Ti), aluminum (Al), gold (Au), nickel (Ni), oxide thereof, alloy thereof, and the like alone or in combination, but the disclosure is not limited thereto. According to an embodiment, the first and second additional electrodes may also include transparent conductive oxide such as indium tin oxide (ITO), indium zinc oxide (IZO), zinc oxide (ZnO), indium gallium zinc oxide (IGZO), and indium tin zinc oxide (ITZO).

The materials included in the first and second additional electrodes may be the same as or different from each other. The first and second additional electrodes may be substantially transparent or translucent. Therefore, the light generated by the light emitting element LD may pass through each of the first and second additional electrodes and may be emitted to the outside of the light emitting element LD. According to an embodiment, when the light generated by the light emitting element LD does not pass through the first and second additional electrodes and is emitted to the outside of the light emitting element LD through a region except for the both ends of the light emitting element LD, the first and second additional electrodes may include an opaque metal.

In an embodiment of the disclosure, the light emitting element LD may further include an insulating layer 14. However, according to an embodiment, the insulating layer 14 may be omitted and may be provided so as to cover only a portion of the first semiconductor layer 11, the active layer 12, and the second semiconductor layer 13.

The insulating layer 14 may prevent an electrical short that may occur when the active layer 12 contacts a conductive material other than the first and second semiconductor layers 11 and 13. The insulating layer 14 may reduce or minimize a surface defect of the light emitting element LD to improve life and light emission efficiency of the light emitting element LD. When a plurality of light emitting elements LD are closely disposed, the insulating layer 14 may prevent an unwanted short that may occur between the adjacent light emitting elements LD. When the active layer 12 may prevent an occurrence of a short with an external conductive material, presence or absence of the insulating layer 14 is not limited.

The insulating layer 14 may be provided in a form entirely surrounding an outer surface (e.g., an outer peripheral surface or an outer circumferential surface) of the light emitting stack including the first semiconductor layer 11, the active layer 12, and the second semiconductor layer 13.

In the above-described embodiment, the insulating layer 14 entirely surrounds the outer surface (e.g., an outer peripheral surface or an outer circumferential surface) of each of the first semiconductor layer 11, the active layer 12, and the second semiconductor layer 13, but the disclosure is not limited thereto. According to an embodiment, when the light emitting element LD includes the first additional electrode, the insulating layer 14 may entirely surround an outer surface (e.g., an outer peripheral surface or an outer circumferential surface) of each of the first semiconductor layer 11, the active layer 12, the second semiconductor layer 13, and the first additional electrode. According to another embodiment, the insulating layer 14 may not entirely surround the outer surface (e.g., an outer peripheral surface or an outer circumferential surface) of the first additional electrode, or may surround only a portion of the outer surface (e.g., an outer peripheral surface or an outer circumferential surface) of the first additional electrode and may not surround the remaining portion of the outer surface (e.g., an outer peripheral surface or an outer circumferential surface) of the first additional electrode. According to an embodiment, when the first additional electrode is disposed at the other end (or the upper end) of the light emitting element LD and the second additional electrode is disposed at the one end (or the lower end) of the light emitting element LD, the insulating layer 14 may expose at least one region of each of the first and second additional electrodes.

The insulating layer 14 may include a transparent insulating material. For example, the insulating layer 14 may include at least one insulating material selected from a group including silicon oxide ($SiO_x$), silicon nitride ($SiN_x$), silicon oxynitride ($SiO_xN_y$), aluminum oxide ($AlO_x$), and titanium oxide ($TiO_2$), but the disclosure is not limited thereto, and various materials having insulating properties may be used as the material of the insulating layer 14.

According to an embodiment, the light emitting element LD may be implemented with a light emitting pattern of a core-shell structure. In this case, the above-described first semiconductor layer 11 may be positioned in a core, that is, a middle (or a center) of the light emitting element LD, the active layer 12 may be provided and/or formed in a form surrounding the outer surface (e.g., an outer peripheral surface or an outer circumferential surface) of the first semiconductor layer 11, and the second semiconductor layer 13 may be provided and/or formed in a form surrounding the outer surface (e.g., an outer peripheral surface or an outer circumferential surface) of the active layer 12. When the light emitting element LD is implemented with the light emitting pattern of the core-shell structure, the light emitting element LD may further include an additional electrode surrounding at least one side of the second semiconductor layer 13 along the edge or periphery of the second semiconductor layer 13. According to an embodiment, the light emitting element LD may further include the insulating layer 14 provided on an outer surface (e.g., an outer peripheral surface or an outer circumferential surface) of the light emitting pattern of the core-shell structure and including a transparent insulating material. The light emitting element LD implemented with the light emitting pattern having the core-shell structure may be manufactured by a growth method.

The above-described light emitting element LD may be used as a light emitting source of various display devices. The light emitting element LD may be manufactured through a surface treatment process. For example, when a plurality of light emitting elements LD are mixed in a fluid solution (or solvent) and supplied to each pixel area (for example, a emission area of each pixel or a emission area of each sub pixel), surface treatment may be performed on each of the light emitting elements LD so that the light emitting elements LD may be uniformly sprayed without being unevenly aggregated in the solution.

A light emitting unit (or a light emitting device) including the light emitting element LD described above may be used in various types of electronic devices that require a light source, including a display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
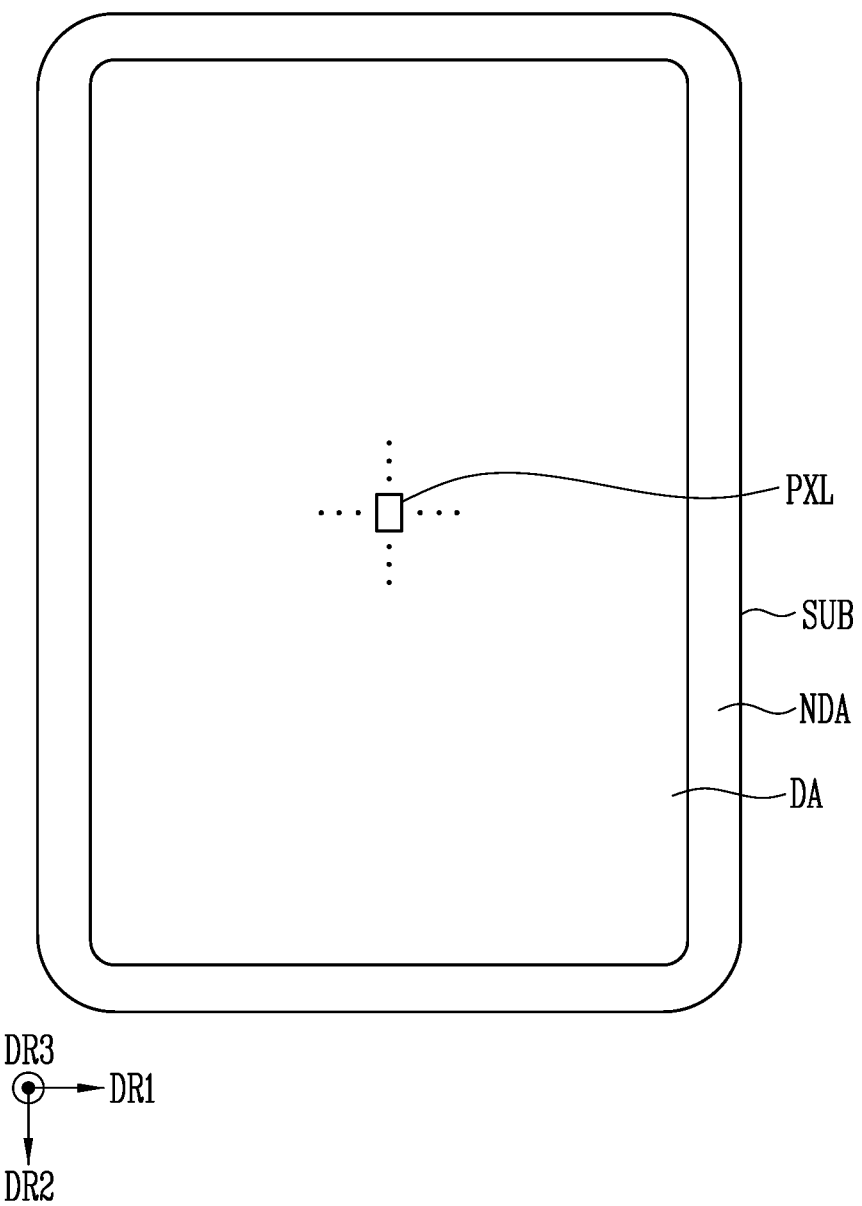
FIG. 3 is a schematic plan view illustrating a display device according to an embodiment of the disclosure, for example, a display device using the light emitting element shown in FIGS. 1 and 2 as a light source.

FIG. 3 is a schematic plan view illustrating a display device according to an embodiment of the disclosure, for example, a display device using the light emitting element shown in FIGS. 1 and 2 as a light source.

In FIG. 3, for convenience, a structure of the display device is briefly shown based on a display area DA where an image is displayed.

Referring to FIGS. 1-3, the display device according to an embodiment of the disclosure may include a substrate SUB, a plurality of pixels PXL provided on the substrate SUB and each including at least one light emitting element LD, the driver provided on the substrate SUB and driving the pixels PXL, a line portion connecting the pixels PXL and the driver to each other.

When the display device is an electronic device to which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or wearable device, the disclosure may be applied to the display device.

The display device may be classified into a passive matrix type display device and an active matrix type display device according to a method of driving the light emitting element LD. For example, when the display device is implemented as an active matrix type, each of the pixels PXL may include a driving transistor that controls a current amount supplied to the light emitting element LD, a switching transistor that transfers a data signal to the driving transistor, and the like.

The display device may be provided in various shapes, and for example, may be provided in a rectangular plate shape having two pairs of sides parallel to each other, but the disclosure is not limited thereto. When the display device is provided in the rectangular plate shape, one pair of sides of the two pairs of sides may be provided to be longer than the other pair of sides. For convenience, the display device has a rectangular shape having a pair of long sides and a pair of short sides. In an embodiment, an extension direction of a long side is denoted as a second direction DR2, an extension direction of a short side is denoted as a first direction DR1, and a direction perpendicular to the extension direction of the long side and the short side is denoted as a third direction DR3. The display device provided in the rectangular plate shape may have a round shape in a corner portion where one long side and one short side contact (or meet), but the disclosure is not limited thereto.

The substrate SUB may include the display area DA and a non-display area NDA.

The display area DA may be an area where the pixels PXL displaying an image are provided. The non-display area NDA may be an area where the driver for driving the pixels PXL and a portion of the line portion connecting the pixels PXL and the driver to each other are provided. For convenience, only one pixel PXL is shown in FIG. 3, but substantially a plurality of pixels PXL may be provided in the display area DA of the substrate SUB.

The non-display area NDA may be provided on at least one side of the display area DA. The non-display area NDA may surround a periphery (or an edge) of the display area DA. The non-display area NDA may be provided with the line portion connected to the pixels PXL, and the driver connected to the line portion and driving the pixels PXL.

The line portion may electrically connect the driver and the pixels PXL to each other. The line portion may provide a signal to each pixel PXL and may be signal lines connected to each pixel PXL, for example, fan-out lines connected to a scan line, a data line, an emission control line, and the like. In an embodiment, the line portion may be signal lines connected to each pixel PXL, for example, fan-out lines connected to a control line, a sensing line, and the like, in order to compensate for an electrical characteristic change of each pixel PXL in real time.

The substrate SUB may include a transparent insulating material and may transmit light. The substrate SUB may be a rigid substrate or a flexible substrate.

One area on the substrate SUB may be provided as the display area DA and thus the pixels PXL may be disposed. The remaining area on the substrate SUB may be provided as the non-display area NDA. For example, the substrate SUB may include the display area DA including pixel areas in which each pixel PXL is disposed, and the non-display area NDA disposed around the display area DA (or adjacent to the display area DA) along the edge or periphery of the display area DA.

Each of the pixels PXL may be provided in the display area DA on the substrate SUB. In an embodiment of the disclosure, the pixels PXL may be arranged in the display area DA in a stripe arrangement structure or a PENTILE® arrangement structure, but the disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PXL may include at least one light emitting element LD driven by corresponding scan signal and data signal. The light emitting element LD may have a size as small as a nano scale to a micro scale and may be connected in parallel with adjacent light emitting elements, but the disclosure is not limited thereto. The light emitting element LD may configure a light source of each of the pixels PXL.

Each of the pixels PXL may include at least one light source driven by a signal (e.g., a set or predetermined signal (for example, a scan signal, a data signal, and the like)) and/or power (e.g., set or predetermined power (for example, first driving power, second driving power, and the like)), for example, the light emitting element LD shown in FIG. 1. However, the type of the light emitting element LD that may be used as the light source of each of the pixels PXL is not limited thereto.

The driver may provide the signal (e.g., a set or predetermined signal) and the power (e.g., a set or predetermined power) to each pixel PXL through the line portion, thereby controlling driving of the pixel PXL. The driver may include a scan driver, an emission driver, a data driver, and a timing controller.

Figure 4:
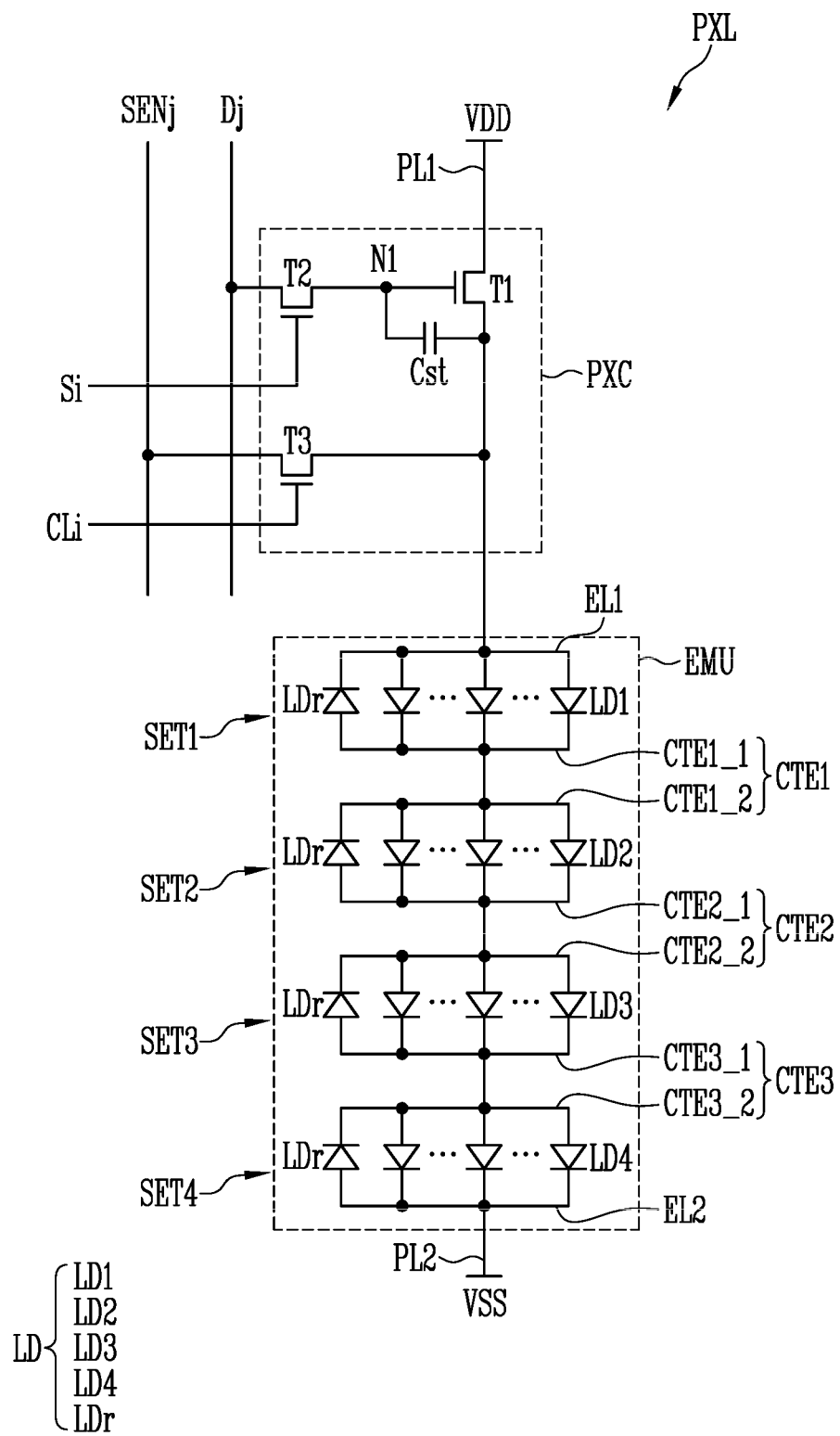
FIG. 4 is circuit diagram illustrating an electrical connection relationship between components included in one pixel shown in FIG. 3 according to an embodiment.

FIG. 4 is circuit diagram illustrating an electrical connection relationship of components included in one pixel shown in FIG. 3 according to an embodiment.

For example, FIG. 4 shows the electrical connection relationship of the components included in the pixel PXL that may be applied to the active display device according to an embodiment. However, a type of the components included in the pixel PXL to which an embodiment of the disclosure may be applied is not limited thereto.

In FIG. 4, not only the components included in each of the pixels shown in FIG. 3 but also an area where the components are provided are referred to as the pixel PXL.

Referring to FIGS. 1-4, one pixel PXL (hereinafter referred to as a 'pixel') may include a light emitting unit EMU that generates light of a luminance corresponding to the data signal. The pixel PXL may selectively further include a pixel circuit PXC for driving the light emitting unit EMU.

The pixel circuit PXC may be connected to a scan line Si and a data line Dj of a corresponding pixel PXL. For example, when the pixel PXL is disposed in an ith (i is a natural number) row and a jth (j is a natural number) column of the display area DA, the pixel circuit PXC of the pixel PXL may be connected to an ith scan line Si and a jth data line Dj of the display area DA. In an embodiment, the pixel circuit PXC may be connected to an ith control line CLi and a jth sensing line SENj of the display area DA.

The pixel circuit PXC described above may include first to third transistors T1 to T3 and a storage capacitor Cst.

A first terminal of the second transistor T2 (e.g., a switching transistor) may be connected to the jth data line Dj, and a second terminal of the second transistor T2 may be connected to a first node N1. Here, the first terminal and the second terminal of the second transistor T2 may be different terminals. For example, when the first terminal is a source electrode, the second terminal may be a drain electrode. In an embodiment, a gate electrode of the second transistor T2 may be connected to the ith scan line Si.

The second transistor T2 may be turned on when a scan signal of a voltage at which the second transistor T2 may be turned on (e.g., a high-level voltage) is supplied from the ith scan line Si, to electrically connect the jth data line Dj and the first node N1 to each other. At this time, a data signal of a corresponding frame is supplied to the jth data line Dj, and thus the data signal is transferred to the first node N1. The data signal transferred to the first node N1 is charged in the storage capacitor Cst (i.e. the storage capacitor Cst is charged to a voltage corresponding to the data signal from the jth data line Dj.

A first terminal of the first transistor T1 (e.g., a driving transistor) may be connected to first driving power VDD, and a second terminal may be electrically connected to a first electrode EL1 of each of the light emitting elements LD. A gate electrode of the first transistor T1 may be connected to the first node N1. The first transistor T1 may control an amount of a driving current supplied to the light emitting elements LD in correspondence with a voltage of the first node N1.

The third transistor T3 may be connected between the second terminal of the first transistor T1 and the jth sensing line SENj. For example, a first terminal of the third transistor T3 may be connected to the second terminal (for example, the source electrode) of the first transistor T1 that is connected to the first electrode EL1, and a second terminal of the third transistor T3 may be connected to the jth sensing line SENj. A gate electrode of the third transistor T3 may be connected to the ith control line CLi. The third transistor T3 is turned on by a control signal of a gate-on voltage (e.g., a high-level voltage) supplied to the ith control line CLi during a sensing period (e.g., a set or predetermined sensing period), to electrically connect the jth sensing line SENj and the first transistor T1 to each other.

The sensing period may be a period for extracting characteristic information (for example, a threshold voltage of the first transistor T1, and the like) of each of the pixels PXL disposed in the display area DA.

One electrode of the storage capacitor Cst may be connected to the second terminal of the first transistor T1 that is connected to the first electrode EL1, and another electrode may be connected to the first node N1. The storage capacitor Cst may charge to a voltage corresponding to the data signal supplied to the first node N1 and maintain the charged voltage until the data signal of a next frame is supplied.

The light emitting unit EMU may include a plurality of light emitting elements LD connected in parallel (and/or in series) between a first power line PL1 to which a voltage of the first driving power VDD is applied and a second power line PL2 to which a voltage of second driving power VSS is applied. For example, the light emitting unit EMU may include a first electrode EL1 (or a "first alignment electrode") connected to the first driving power VDD via the pixel circuit PXC and the first power line PL1, a second electrode EL2 (or a "second alignment electrode") connected to the second driving power VSS via the second power line PL2, and the plurality of light emitting elements LD connected in parallel (or in series) in the same direction between the first and second electrodes EL1 and EL2.

Each of the light emitting elements LD included in the light emitting unit EMU may include one end connected to the first driving power VDD through the first electrode EL1 and another end connected to the second driving power VSS through the second electrode EL2. The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during an emission period of the pixel PXL.

As described above, the respective light emitting elements LD connected in parallel in the same direction (for example, a forward direction) between the first electrode EL1 and the second electrode EL2 to which voltages of different potentials are respectively supplied may configure respective effective light sources. Such effective light sources may be gathered to configure the light emitting unit EMU of the pixel PXL.

The light emitting elements LD of the light emitting unit EMU may emit light at a luminance corresponding to a driving current supplied through a corresponding pixel circuit PXC. For example, the pixel circuit PXC may supply a driving current corresponding to a grayscale value of corresponding frame data to the light emitting unit EMU during each frame period. The driving current supplied to the light emitting unit EMU may be divided and flow to each of the light emitting elements LD. Therefore, each of the light emitting elements LD may emit light at a luminance corresponding to the current flowing through the light emitting element LD, and thus the light emitting unit EMU may emit light of the luminance corresponding to the driving current.

According to an embodiment, the light emitting unit EMU may further include at least one ineffective light source, for example, a reverse light emitting element LDr, in addition to the light emitting elements LD configuring each effective light source. The reverse light emitting element LDr may be connected in parallel between the first and second electrodes EL1 and EL2 together with the light emitting elements LD configuring the effective light sources, and may be connected between the first and second electrodes EL1 and EL2 in a direction opposite to the light emitting elements LD. The reverse light emitting element LDr maintains an inactive state even though a driving voltage (e.g., a set or predetermined driving voltage (for example, a driving voltage of a forward direction)) is applied between the first and second electrodes EL1 and EL2, and thus a current substantially does not flow through the reverse light emitting element LDr.

Each light emitting unit EMU may be configured to include at least one serial stage including the plurality of light emitting elements LD connected in parallel with each other. For example, the light emitting unit EMU may be configured in a serial/parallel mixed structure as shown in FIG. 4.

The light emitting unit EMU may include first to fourth serial stages SET1 to SET4 sequentially connected between the first and second driving power VDD and VSS. Each of the first to fourth serial stages SET1 to SET4 may include two electrodes, for example, EL1 and CTE1_1, CTE1_2 and CTE2_1, CTE2_2 and CTE3_1, or CTE3_2 and EL2. The two electrodes in each stage may be configured as an electrode pair of the corresponding one of the serial stages SET1, SET2, SET3, and SET4. A plurality of light emitting elements LD may be connected in parallel in the same direction between the two electrodes EL1 and CTE1_1, CTE1_2 and CTE2_1, CTE2_2 and CTE3_1, or CTE3_2 and EL2 of the serial stages SET1, SET2, SET3, and SET4.

The first serial stage SET1 may include the first electrode EL1, the (1-1)th intermediate electrode CTE1_1, and at least one first light emitting element LD1 connected between the first electrode EL1 and the (1-1)th intermediate electrode CTE1_1. The first serial stage SET1 may include the reverse light emitting element LDr connected in a direction opposite to the first light emitting element LD1 between the first electrode EL1 and the (1-1)th intermediate electrode CTE1_1.

The second serial stage SET2 may include the (1-2)th intermediate electrode CTE1_2, the (2-1)th intermediate electrode CTE2_1, and at least one second light emitting element LD2 connected between the (1-2)th intermediate electrode CTE1_2 and the (2-1)th intermediate electrode CTE2_1. The second serial stage SET2 may include the reverse light emitting element LDr connected in a direction opposite to the second light emitting element LD2 between the (1-2)th intermediate electrode CTE1_2 and the (2-1)th intermediate electrode CTE2_1.

The (1-1)th intermediate electrode CTE1_1 of the first serial stage SET1 and the (1-2)th intermediate electrode CTE1_2 of the second serial stage SET2 may be integrally provided and connected to each other. For example, the (1-1)th intermediate electrode CTE1_1 and the (1-2)th intermediate electrode CTE1_2 may configure a first intermediate electrode CTE1 that electrically connects the continuous first serial stage SET1 and the second serial stage SET2. When the (1-1)th intermediate electrode CTE1_1 and the (1-2)th intermediate electrode CTE1_2 are integrally provided, the (1-1)th intermediate electrode CTE1_1 and the (1-2)th intermediate electrode CTE1_2 are may be different regions of the first intermediate electrode CTE1.

The third serial stage SET3 may include the (2-2)th intermediate electrode CTE2_2, the (3-1)th intermediate electrode CTE3_1, and at least one third light emitting element LD3 connected between the (2-2)th intermediate electrode CTE2_2 and the (3-1)th intermediate electrode CTE3_1. The third serial stage SET3 may include the reverse light emitting element LDr connected in a direction opposite to the third light emitting element LD3 between the (2-2)th intermediate electrode CTE2_2 and the (3-1)th intermediate electrode CTE3_1.

The (2-1)th intermediate electrode CTE2_1 of the second serial stage SET2 and the (2-2)th intermediate electrode CTE2_2 of the third serial stage SET3 may be integrally provided and connected to each other. For example, the (2-1)th intermediate electrode CTE2_1 and the (2-2)th intermediate electrode CTE2_2 may configure a second intermediate electrode CTE2 that electrically connects the continuous second serial stage SET2 and the third serial stage SET3. When the (2-1)th intermediate electrode CTE2_1 and the (2-2)th intermediate electrode CTE2_2 are integrally provided, the (2-1)th intermediate electrode CTE2_1 and the (2-2)th intermediate electrode CTE2_2 may be different regions of the intermediate electrode CTE2.

The fourth serial stage SET4 may include the (3-2)th intermediate electrode CTE3_2, the second electrode EL2, and at least one fourth light emitting element LD4 connected between the (3-2)th intermediate electrode CTE3_2 and the second electrode EL2. The fourth serial stage SET4 may include the reverse light emitting element LDr connected in a direction opposite to the fourth light emitting element LD4 between the (3-2)th intermediate electrode CTE3_2 and the second electrode EL2.

The (3-1)th intermediate electrode CTE3_1 of the third serial stage SET3 and the (3-2)th intermediate electrode CTE3_2 of the fourth serial stage SET4 may be integrally provided and connected to each other. For example, the (3-1)th intermediate electrode CTE3_1 and the (3-2)th intermediate electrode CTE3_2 may configure a third intermediate electrode CTE3 that electrically connects the continuous third serial stage SET3 and the fourth serial stage SET4. When the (3-1)th intermediate electrode CTE3_1 and the (3-2)th intermediate electrode CTE3_2 are integrally provided, the (3-1)th intermediate electrode CTE3_1 and the (3-2)th intermediate electrode CTE3_2 may be different regions of the third intermediate electrode CTE3.

In the above-described embodiment, the first electrode EL1 of the first serial stage SET1 may be an anode electrode of the light emitting unit EMU of each pixel PXL, and the second electrode EL2 of the fourth serial stage SET4 may be a cathode electrode of the light emitting unit EMU.

FIG. 4 discloses an embodiment in which all of the first to third transistors T1 to T3 are N-type transistors, but the disclosure is not limited thereto. For example, at least one of the above-described first to third transistors T1 to T3 may be changed to a P-type transistor. FIG. 4 discloses an embodiment in which the light emitting unit EMU is connected between the pixel circuit PXC and the second driving power VSS, but the light emitting unit EMU may be connected between the first driving power VDD and the pixel circuit PXC.

A structure of the pixel circuit PXC may be variously changed. For example, the pixel circuit PXC may further include at least one transistor element such as a transistor element for initializing the first node N1, and/or a transistor element for controlling an emission time of the light emitting elements LD, and other circuit elements such as a boosting capacitor for boosting the voltage of the first node N1.

A structure of the pixel PXL that may be applied to the disclosure is not limited to the embodiment shown in FIG. 4, and the corresponding pixel PXL may have various structures. For example, each pixel PXL may be configured inside a passive light emitting display device or the like. In this case, the pixel circuit PXC may be omitted, and the both ends of the light emitting elements LD included in the light emitting unit EMU may be directly connected to the ith scan line Si, the jth data line Dj, the first power line PL1 to which the first driving power VDD is applied, the second power line PL2 to which the second driving power VSS is applied, a control line (e.g., a set or predetermined control line), and/or the like.

Figure 5:
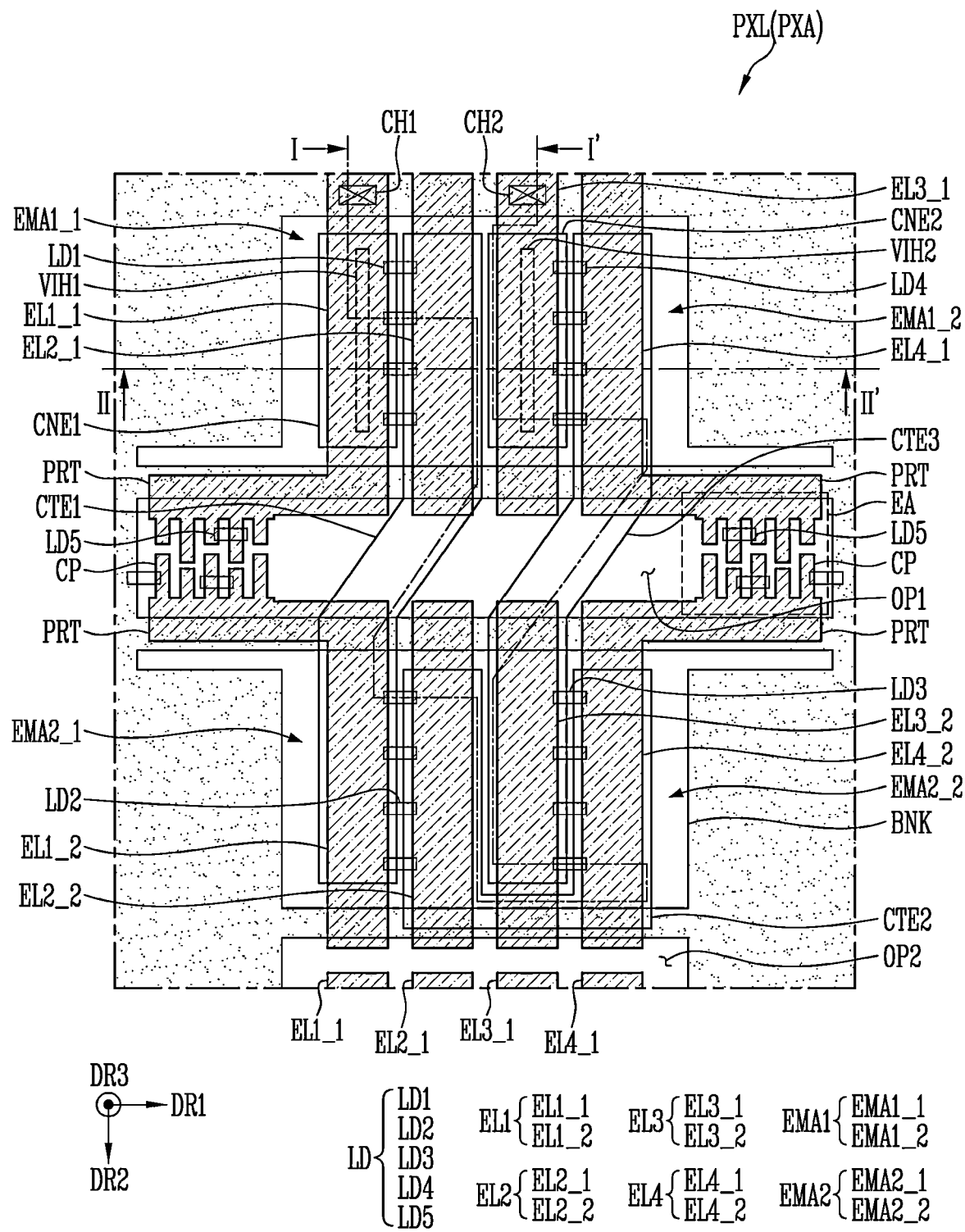
FIG. 5 is a plan view schematically illustrating one of pixels shown in FIG. 3.
Figure 6:
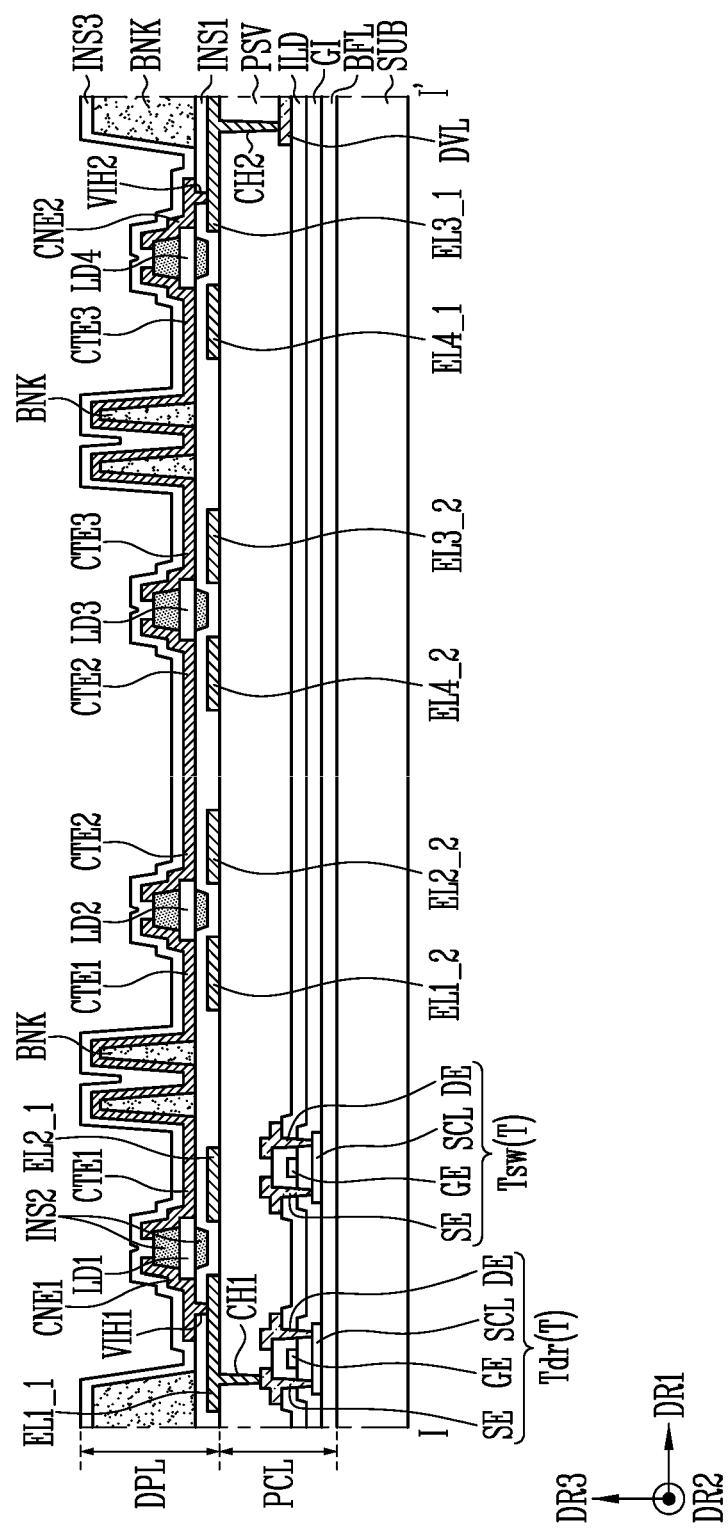
FIG. 6 is a cross-sectional view taken along the line I~I' of FIG. 5.
Figure 7:
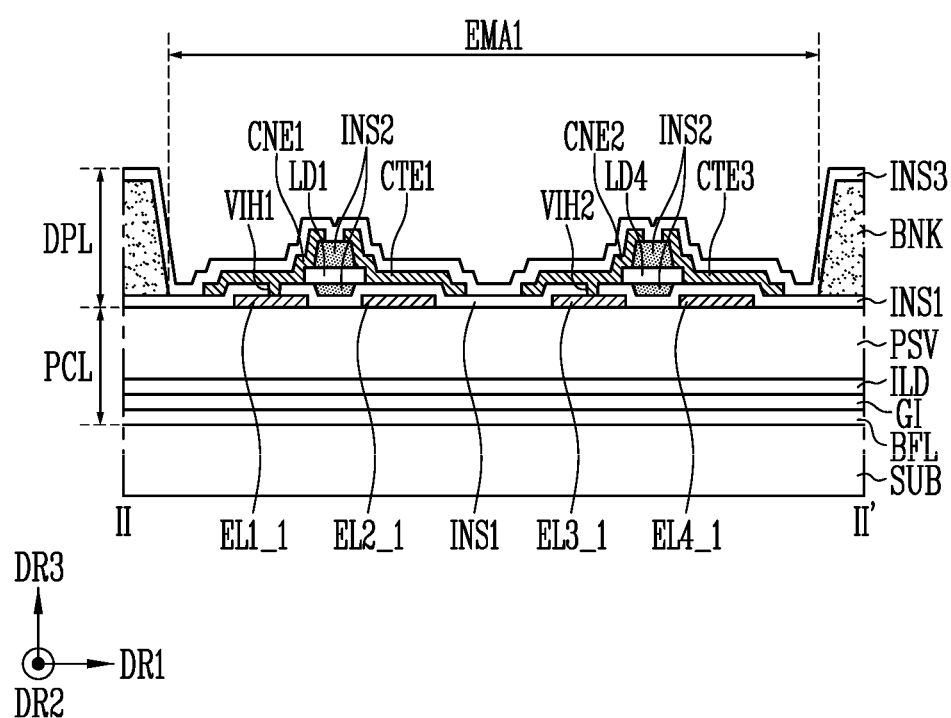
FIG. 7 is a cross-sectional view taken along the line II~II' of FIG. 5.
Figure 8:
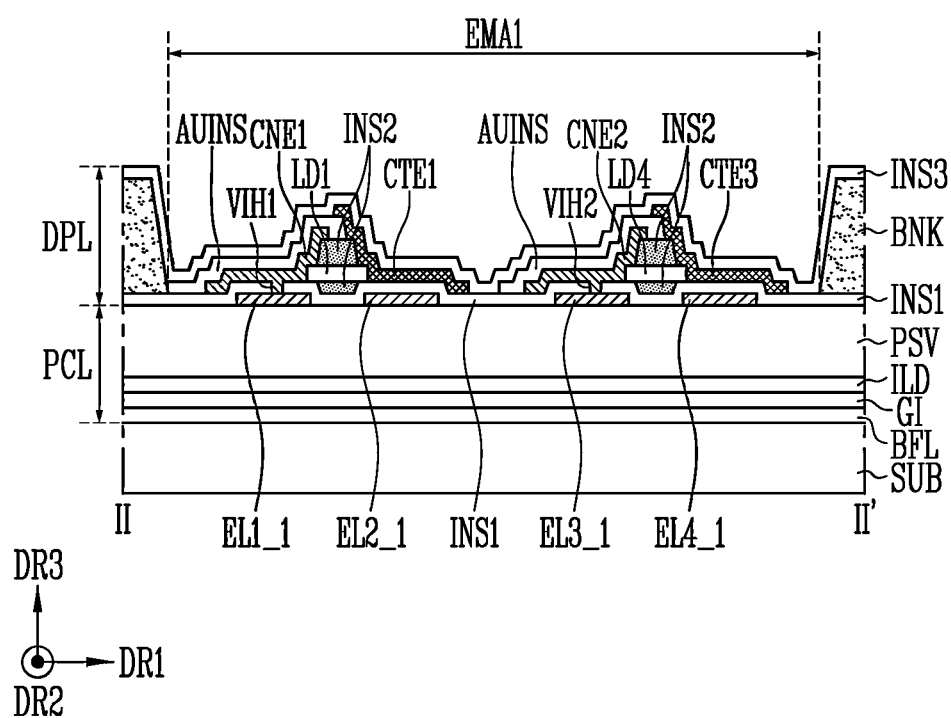
FIG. 8 is a cross-sectional view corresponding to the line II~II' of FIG. 5 as implementation of first and third intermediate electrodes of FIG. 6 according to another embodiment.

FIG. 5 is a plan view schematically illustrating one of the pixels shown in FIG. 3, FIG. 6 is a cross-sectional view taken along the line I~I' of FIG. 5, FIG. 7 is a cross-sectional view taken along the line II~II' of FIG. 5, and FIG. 8 is a cross-sectional view corresponding to the line II~II' of FIG. 5 as implementation of the first and third intermediate electrodes of FIG. 6 according to another embodiment.

In FIG. 5, for convenience, transistors T electrically connected to the light emitting elements LD and signal lines connected to the transistors T are omitted.

In FIGS. 6-8, one pixel PXL is simplified and shown such as showing each electrode as an electrode of a single layer and each insulating layer as an insulating layer of a single layer, but the disclosure is not limited thereto.

In an embodiment of the disclosure, "connection" between two configurations may mean that both electrical and physical connections are used.

In an embodiment of the disclosure, for convenience of description, a traverse direction (or a horizontal direction) on a plane is denoted as the first direction DR1, a longitudinal direction (or a vertical direction) on the plane is denoted as the second direction DR2, and a thickness direction of the substrate SUB on the cross section is denoted as the third direction DR3. The first to third directions DR1, DR2, and DR3 may refer to directions indicated by the first to third directions DR1, DR2, and DR3, respectively.

Referring to FIGS. 5-8, the display device according to an embodiment may include the plurality of pixels PXL provided on the substrate SUB. Each pixel PXL may be provided in a pixel area PXA on the substrate SUB.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material applied to the substrate SUB may preferably have resistance (or heat resistance) to a high process temperature in a manufacturing process of the display device.

The pixel area PXA may include emission areas EMA1 and EMA2 in which light is emitted and a peripheral area adjacent to the emission areas EMA1 and EMA2 (or surrounding a periphery of the emission areas). Here, the peripheral area may include a non-emission area in which light is not emitted. In an embodiment of the disclosure, for convenience, the pixel area PXA is shown as being divided into two emission areas EMA1 and EMA2, but the disclosure is not limited thereto. According to an embodiment, the pixel area PXA may include one emission area.

The line portion electrically connected to the pixels PXL may be positioned on the substrate SUB. The line portion may include a plurality of signal lines for transferring a signal (e.g., a set or predetermined signal (or a voltage (e.g., a set or predetermined voltage)) to each pixel PXL. The signal lines may include the ith scan line Si transferring a scan signal to each pixel PXL, the jth data line Dj transferring a data signal to each pixel PXL, and power lines PL1 and DVL transferring driving power to each pixel PXL. According to an embodiment, the line portion may further include an emission control line transferring an emission control signal to each pixel PXL. According to another embodiment, the line portion may further include a sensing line and a control line connected to each pixel PXL.

Each pixel PXL may include a pixel circuit layer PCL and a display element layer DPL.

For convenience, the pixel circuit layer PCL is first described, and then the display element layer DPL is described.

The pixel circuit layer PCL may include a buffer layer BFL, the pixel circuit PXC, and a passivation layer PSV.

The buffer layer BFL may prevent an impurity from being diffused into the transistors T included in the pixel circuit PXC. The buffer layer BFL may be an inorganic insulating layer including an inorganic material. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single layer, but may also be provided as multiple layers of at least two layers. When the buffer layer BFL is provided as multiple layers, each layer may be formed of the same material or may be formed of different materials. The buffer layer BFL may be omitted according to the material, a process condition, and the like of the substrate SUB.

The pixel circuit PXC may include at least one transistor T and the storage capacitor Cst. The transistor T may include a driving transistor Tdr controlling the driving current of the light emitting elements LD and a switching transistor Tsw connected to the driving transistor Tdr. However, the disclosure is not limited thereto, and the pixel circuit PXC may further include circuit elements performing other functions in addition to the driving transistor Tdr and the switching transistor Tsw. In the following embodiment, the driving transistor Tdr and the switching transistor Tsw are collectively referred to as a transistor T or transistors T. The driving transistor Tdr may have the same configuration as the first transistor T1 described with reference to FIG. 4, and the switching transistor Tsw may have the same configuration as the second transistor T2 described with reference to FIG. 4.

According to an embodiment, a separate transistor may be positioned between the driving transistor Tdr and the light emitting elements LD to substantially adjust the emission time of the light emitting elements LD. Accordingly, a connection between the driving transistor Tdr and the light emitting elements LD may include not only a direct connection but also an indirect connection via a separate transistor.

Each of the driving transistor Tdr and the switching transistor Tsw may include a semiconductor pattern SCL, a gate electrode GE, a first terminal SE, and a second terminal DE. The first terminal SE may be any one of a source electrode and a drain electrode, and the second terminal DE may be the other electrode from among the source electrode and the drain electrode. For example, when the first terminal SE is the source electrode, the second terminal DE may be the drain electrode.

The semiconductor pattern SCL may be provided and/or formed on the buffer layer BFL. The semiconductor pattern SCL may include a first contact region that is in contact with the first terminal SE and a second contact region that is in contact with the second terminal DE. A region between the first contact region and the second contact region may be a channel region. The channel region may overlap the gate electrode GE of a corresponding transistor T. The semiconductor pattern SCL may be a semiconductor pattern formed of polysilicon, amorphous silicon, an oxide semiconductor, or the like. For example, the channel region may be a semiconductor pattern which is not doped with an impurity and may be an intrinsic semiconductor. The first contact region and the second contact region may be a semiconductor pattern doped with an impurity.

The gate electrode GE may be provided and/or formed on a gate insulating layer GI so as to correspond to the channel region of the semiconductor pattern SCL. The gate electrode GE may be provided on the gate insulating layer GI and overlap the channel region of the semiconductor pattern SCL. The gate electrode GE may be formed as a single layer selected from copper (Cu), molybdenum (Mo), tungsten (W), aluminum neodymium (AlNd), titanium (Ti), aluminum (Al), silver (Ag) and an alloy thereof alone or a mixture thereof, or as two layer or multiple layer structure of molybdenum (Mo), titanium (Ti), copper (Cu), aluminum (Al), or silver (Ag) that is a low resistance material in order to reduce a line resistance.

The gate insulating layer GI may be provided on the buffer layer BFL to cover (e.g., completely cover) the buffer layer BFL and the semiconductor pattern SCL. The gate insulating layer GI may be an inorganic insulating layer including an inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to the above-described embodiments. According to an embodiment, the gate insulating layer GI may be formed of an organic insulating layer including an organic material. The gate insulating layer GI may be provided as a single layer, or may be provided as multiple layers of at least two or more layers.

The first terminal SE and the second terminal DE may be provided and/or formed on an interlayer insulating layer ILD and may be in contact with the first contact region and the second contact region of the semiconductor pattern SCL through contact holes sequentially passing through the gate insulating layer GI and the interlayer insulating layer ILD, respectively. For example, the first terminal SE may be in contact with the first contact region of the semiconductor pattern SCL, and the second terminal DE may be in contact with the second contact region of the semiconductor pattern SCL. Each of the first and second terminals SE and DE may include the same material as the gate electrode GE, or may include one or more materials selected from materials discussed above with respect to the gate electrode GE.

The interlayer insulating layer ILD may be provided on the gate insulating layer GI to cover (e.g. completely cover) the gate insulating layer GI and the gate electrode GE. The interlayer insulating layer ILD may include the same material as the gate insulating layer GI, or may include one or more materials selected from materials discussed above with respect to the gate insulating layer GI. The interlayer insulating layer ILD may be provided as a single layer, but may also be provided as multiple layers of at least two layers.

In the above-described embodiment, the first and second terminals SE and DE of each of the driving transistor Tdr and the switching transistor Tsw are described as separate electrodes which are electrically connected to the semiconductor pattern SCL through the contact hole sequentially passing through the gate insulating layer GI and the interlayer insulating layer ILD, but the disclosure is not limited thereto. According to an embodiment, the first terminal SE of each of the driving transistor Tdr and the switching transistor Tsw may be the first contact region adjacent to the channel region of a corresponding semiconductor pattern SCL, and the second terminal DE of each of the driving transistor Tdr and the switching transistor Tsw may be the second contact region adjacent to the channel region of a corresponding semiconductor pattern SCL. In this case, the first terminal SE of the driving transistor Tdr may be electrically connected to the light emitting elements LD of a corresponding pixel PXL through a separate connection means such as a bridge electrode.

In an embodiment of the disclosure, the transistors T included in the pixel circuit PXC may be configured of a low temperature polycrystalline silicon thin film transistor, but the disclosure is not limited thereto. According to an embodiment, the transistors T included in the pixel circuit PXC may be configured of an oxide semiconductor thin film transistor. For example, a case where the transistors T are thin film transistors of a top gate structure is described herein, but the disclosure is not limited thereto. A structure of the transistors T may be variously changed.

The pixel circuit layer PCL may include the driving voltage line DVL provided and/or formed on the interlayer insulating layer ILD. The driving voltage line DVL may have the same configuration as the second power line PL2 described with reference to FIG. 4. Accordingly, a voltage of the second driving power VSS may be applied to the driving voltage line DVL. The pixel circuit layer PCL may further include the first power line PL1 connected to the first driving power VDD. Although not directly shown in the drawing, the first power line PL1 may be provided at the same layer as the driving voltage line DVL or may be provided at a layer different from that of the driving voltage line DVL. In the above-described embodiment, the driving voltage line DVL is provided at the same layer as the first and second terminals SE and DE of the transistors T, but the disclosure is not limited thereto. According to an embodiment, the driving voltage line DVL may be provided at the same layer as any one of conductive layers provided in the pixel circuit layer PCL. In other words, a position of the driving voltage line DVL in the pixel circuit layer PCL may be variously changed.

Each of the first power line PL1 and the driving voltage line DVL may include a conductive material. For example, each of the first power line PL1 and the driving voltage line DVL may be formed as a single layer selected from copper (Cu), molybdenum (Mo), tungsten (W), aluminum neodymium (AlNd), titanium (Ti), aluminum (Al), silver (Ag) and an alloy thereof alone or a mixture thereof, or as two layer or multiple layer structure of molybdenum (Mo), titanium (Ti), copper (Cu), aluminum (Al), or silver (Ag) that is a low resistance material in order to reduce a line resistance. For example, each of the first power line PL1 and the driving voltage line DVL may be formed of two layers in which titanium (Ti)/copper (Cu) are sequentially stacked.

The first power line PL1 may be electrically connected to a portion of the display element layer DPL, for example, a first electrode EL1, and the driving voltage line DVL may be electrically connected to another configuration of the display element layer DPL, for example, a third electrode EL3. The first power line PL1 and the driving voltage line DVL may transfer an alignment signal (or an alignment voltage) to first to fourth electrodes EU to EL4 to align the light emitting elements LD in the pixel area PXA of each of the pixels PXL. In an embodiment, each of the first power line PL1 and the driving voltage line DVL may transfer a voltage of corresponding driving power to each pixel PXL after the alignment of the light emitting elements LD to drive the light emitting elements LD.

The passivation layer PSV may be provided and/or formed on the transistors T, the interlayer insulating layer ILD, and the driving voltage line DVL.

The passivation layer PSV may be provided in a form including an organic insulating layer, an inorganic insulating layer, or the organic insulating layer disposed on the inorganic insulating layer. For example, the inorganic insulating layer may include at least one of metal oxides such as silicon oxide ($SiO_x$), silicon nitride ($SiN_x$), silicon oxynitride ($Si-O_xN_y$), and aluminum oxide ($AlO_x$). For example, the organic insulating layer may include at least one of an acrylic resin, an epoxy resin, a phenolic resin, a polyamide resin, a polyimide resin, an unsaturated polyester resin, a poly-phenylene ethers resin, a poly-phenylene sulfides resin, and a benzocyclobutene resin.

The passivation layer PSV may include a first contact hole CH1 exposing the first terminal SE of the driving transistor Tdr and a second contact hole CH2 exposing the driving voltage line DVL.

The display element layer DPL may be provided on the passivation layer PSV.

The display element layer DPL may include a bank BNK, the first to fourth electrodes EL1 to EL4, the light emitting elements LD, first and second contact electrodes CNE1 and CNE2, the first to third intermediate electrodes CTE1 to CTE3, and first to third insulating layers INS1 to INS3.

The bank BNK may be positioned in the peripheral area surrounding at least one side of the emission areas EMA1 and EMA2 of each of the pixels PXL. The bank BNK may be a structure that defines (or partitions) the pixel area PXA or the emission areas EMA1 and EMA2 of a corresponding pixel PXL and each of the pixels PXL adjacent to the corresponding pixel PXL, and may be, for example, a pixel defining layer. The bank BNK may be configured to include at least one light blocking material and/or reflective material to prevent a light leakage defect in which light (or ray) is leaked between the corresponding pixel PXL and the pixels PXL adjacent thereto. In the above-described embodiment, the pixel area PXA in which each pixel PXL is provided is divided into a plurality of emission areas EMA1 and EMA2 by the bank BNK, but the disclosure is not limited thereto. According to an embodiment, the pixel area PXA in which each of the pixels PXL is provided may be partitioned to include one emission area by the bank BNK. Alternatively, as described with reference to FIG. 4, when each pixel PXL includes the light emitting unit EMU including the four serial stages SET1 to SET4, the pixel area PXA in which the corresponding pixel PXL is provided may be partitioned into four emission areas.

The bank BNK may include a first opening OP1 and a second opening OP2 exposing elements positioned under the bank BNK. The pixel area PXA of each pixel PXL may include the first emission area EMA1 and the second emission area EMA2 spaced from each other with the first opening OP1 therebetween. The second opening OP2 may be positioned to be spaced from the first opening OP1 in the pixel area PXA of each of the pixels PXL, and may be positioned adjacent to one side (for example, a lower side or an upper side) of the pixel area PXA.

Each of the first to fourth electrodes EU to EL4 may include two electrodes positioned in the same column in the pixel area PXA. For example, the first electrode EL1 may include a (1-1)th electrode EL1_1 and a (1-2)th electrode EL1_2 that are positioned in the same column and spaced from each other in the second direction DR2, the second electrode EL2 may include a (2-1)th electrode EL2_1 and a (2-2)th electrode EL2_2 that are positioned in the same column and spaced from each other in the second direction DR2, the third electrode EL3 may include a (3-1)th electrode EL3_1 and a (3-2)th electrode EL3_2 that are positioned in the same column and spaced from each other in the second direction DR2, and the fourth electrode EL4 may include a (4-1)th electrode EL4_1 and a (4-2)th electrode EL4_2 that are positioned in the same column and spaced from each other in the second direction DR2.

The (1-1)th electrode EL1_1, the (2-1)th electrode EL2_1, the (3-1)th electrode EL3_1, and the (4-1)th electrode EL4_1 may be positioned in the first emission area EMA1 of the corresponding pixel PXL. For example, the (1-1)th electrode EL1_1 and the (2-1)th electrode EL2_1 may be positioned in a (1-1)th emission area EMA1_1 of the first emission area EMA1, the (3-1)th electrode EL3_1 and the (4-1)th electrode EL4_1 may be positioned in a (1-2)th emission area EMA1_2 of the first emission area EMA1.

The (1-2)th electrode EL1_2, the (2-2)th electrode EL2_2, the (3-2)th electrode EL3_2, and the (4-2)th electrode EL4_2 may be positioned in the second emission area EMA2 of the corresponding pixel PXL. For example, the (1-2)th electrode EL1_2 and the (2-2)th electrode EL2_2 may be positioned in a (2-1)th emission area EMA2_1 of the second emission area EMA2, the (3-2)th electrode EL3_2 and the (4-2)th electrode EL4_2 may be positioned in a (2-2)th emission area EMA2_2 of the second emission area EMA2.

An end of each of the (1-1)th to (4-1)th electrodes EL1_1 to EL4_1 and an end of each of the (1-2)th to (4-2)th electrodes EL1_2 to EL4_2 may be positioned in the second opening OP2 of the bank BNK. After the alignment of the light emitting elements LD, the first to fourth electrodes EU to EL4 may be separated from other electrodes (for example, electrodes of an adjacent pixel PXL in the second direction DR2) in the second opening OP2. In other words, the second opening OP2 of the bank BNK may be provided for a separation process for the first to fourth electrodes EL1 to EL4.

Further, an end of each of the (1-1)th to (4-1)th electrodes EL1_1 to EL4_1 and another end of each of the (1-2)th to (4-2)th electrodes EL1_2 to EL4_2 may be positioned in the first opening OP1 of the bank BNK. After the alignment of the light emitting elements LD, each of the (1-1)th to (4-1)th electrodes EL1_1 to EL4_1 and each of the (1-2)th to (4-2)th electrodes EL1_2 to EL4_2 may be separated from each other in the first opening OP1 to configure the light emitting unit EMU of each pixel PXL in four serial stages.

In the first emission area EMA1, each of the (1-1)th to (4-1)th electrodes EL1_1 to EL4_1 may be spaced from an adjacent electrode along the first direction DR1. For example, the (1-1)th electrode EL1_1 may be spaced from the (2-1)th electrode EL2_1, the (2-1)th electrode EL2_1 may be spaced from the (3-1)th electrode EL3_1, and the (3-1)th electrode EL3_1 may be spaced from the (4-1)th electrode EL4_1. A space between the (1-1)th electrode EL1_1 and the (2-1)th electrode EL2_1, the (2-1)th electrode EL2_1 and the (3-1)th electrode EL3_1, and the (3-1)th electrode EL3_1 and the (4-1)th electrode EL4_1 may be substantially identical to each other, but the disclosure is not limited thereto. According to an embodiment, spaces between the (1-1)th electrode EL1_1 and the (2-1)th electrode EL2_1, the (2-1)th electrode EL2_1 and the (3-1)th electrode EL3_1, and the (3-1)th electrode EL3_1 and the (4-1)th electrode EL4_1 may be different from each other.

In the second emission area EMA2, each of the (1-2)th to (4-2)th electrodes EL1_2 to EL4_2 may be spaced from an adjacent electrode along the first direction DR1. For example, the (1-2)th electrode EL1_2 may be spaced from the (2-2)th electrode EL2_2, the (2-2)th electrode EL2_2 may be spaced from the (3-2)th electrode EL3_2, and the (3-2)th electrode EL3_2 may be spaced from the (4-2)th electrode EL4_2. A space between the (1-2)th electrode EL1_2 and the (2-2)th electrode EL2_2, the (2-2)th electrode EL2_2 and the (3-2)th electrode EL3_2, and the (3-2)th electrode EL3_2 and the (4-2)th electrode EL4_2 may be substantially identical to each other, but the disclosure is not limited thereto. According to an embodiment, spaces between the (1-2)th electrode EL1_2 and the (2-2)th electrode EL2_2, the (2-2)th electrode EL2_2 and the (3-2)th electrode EL3_2, and the (3-2)th electrode EL3_2 and the (4-2)th electrode EL4_2 may be different from each other.

Each of the first to fourth electrodes EU to EL4 may be configured of a material having a constant reflectance in order to cause the light emitted from each of the light emitting elements LD to progress in an image display direction (for example, a front direction) of the display device. The first to fourth electrodes EL1 to EL4 may be configured of a conductive material having a constant reflectance. The conductive material may include an opaque metal that is suitable for reflecting the light emitted from the light emitting elements LD in the image display direction of the display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. According to an embodiment, the first to fourth electrodes EL1 to EL4 may include a transparent conductive material. The transparent conductive material may include conductive oxide such as indium tin oxide (ITO), indium zinc oxide (IZO), zinc oxide (ZnO), indium gallium zinc oxide (IGZO), and indium tin zinc oxide (ITZO), conductive polymer such as poly(3,4-ethylenedioxythiophene) (PEDOT), and the like. When the first to fourth electrodes EL1 to EL4 include the transparent conductive material, a separate conductive layer formed of an opaque metal for reflecting the light emitted from the light emitting elements LD in the image display direction of the display device may be added. However, the material of the first to fourth electrodes EL1 to EL4 is not limited to the above-described materials.

In an embodiment, each of the first to fourth electrodes EL1 to EL4 may be provided and/or formed as a single layer, but the disclosure is not limited thereto. According to an embodiment, each of the first to fourth electrodes EL1 to EL4 may be provided and/or formed as multiple layers in which at least two or more materials of metals, alloys, conductive oxides, and conductive polymers are stacked. Each of the first to fourth electrodes EL1 to EL4 may be formed of multiple layers of at least two or more layers to reduce or minimize distortion caused by signal delay when transferring a signal (or voltage) to the both ends of each of the light emitting elements LD. For example, each of the first to fourth electrodes EU to EL4 may be formed of multiple layers in which indium tin oxide (ITO)/silver (Ag)/indium tin oxide (ITO) are sequentially stacked.

A width of each of the first to fourth electrodes EU to EL4 in the first direction DR1 may be the same as or different from the length L of each of the light emitting elements LD. For example, the width of each of the first to fourth electrodes EL1 to EL4 in the first direction DR1 may be greater than the length L of each of the light emitting elements LD. However, the disclosure is not limited thereto, and according to an embodiment, an opposite case may be possible.

The (1-1)th electrode EL1_1 positioned in the first emission area EMA1 may be electrically connected to the driving transistor Tdr of the pixel circuit layer PCL through the first contact hole CH1 of the passivation layer PSV, and the (3-1)th electrode EL3_1 positioned in the first emission area EMA1 may be electrically connected to the driving voltage line DVL of the pixel circuit layer PCL through the second contact hole CH2 of the passivation layer PSV.

Each of the first to fourth electrodes EL1 to EL4 may function as an alignment electrode (or an alignment line) for the alignment of the light emitting elements LD by receiving an alignment signal (e.g., a set or predetermined alignment signal) (or alignment voltage) from a corresponding partial configuration of the pixel circuit layer PCL. For example, the first electrode EL1 may receive a first alignment signal (or a first alignment voltage) from the partial configuration of the pixel circuit layer PCL and function as a first alignment electrode (or a first alignment line), the second electrode EL2 may receive a second alignment signal (or a second alignment voltage) from another configuration of the pixel circuit layer PCL and function as a second alignment electrode (or a second alignment line), the third electrode EL3 may receive a third alignment signal (or a third alignment voltage) from another configuration of the pixel circuit layer PCL and function as a third alignment electrode (or a third alignment line), and the fourth electrode EL4 may receive a fourth alignment signal (or a fourth alignment voltage) from another configuration of the pixel circuit layer PCL and function as a fourth alignment electrode (or a fourth alignment line). At this time, the second alignment signal (or the second alignment voltage) applied to the second electrode EL2 and the third alignment signal (or the third alignment voltage) applied to the third electrode EL3 may be the same signal. The first to fourth alignment signals (or alignment voltages) may be signals having a voltage difference and/or a phase difference of a degree at which the light emitting elements LD may be aligned between the first to fourth electrodes EL1 to EL4. At least one alignment signal (or alignment voltage) from among the first to fourth alignment signals (or alignment voltages) may be an AC signal (or voltage), but the disclosure is not limited thereto.

In the (1-1)th emission area EMA1_1 of the first emission area EMA1, the (1-1)th and (2-1)th electrodes EL1_1 and EL2_1 may configure the first serial stage SET1 together with the plurality of light emitting elements LD (e.g., LD1) connected in parallel therebetween. In the (1-2)th emission area EMA1_2 of the first emission area EMA1, the (3-1)th and (4-1)th electrodes EL3_1 and EL4_1 may configure the fourth serial stage SET4 together with the plurality of light emitting elements LD (e.g., LD4) connected in parallel therebetween.

In the (2-1)th emission area EMA2_1 of the second emission area EMA2, the (1-2)th and (2-2)th electrodes EL1_2 and EL2_2 may configure the second serial stage SET2 together with the plurality of light emitting elements LD (e.g., LD2) connected in parallel therebetween. In the (2-2)th emission area EMA2_2 of the second emission area EMA2, the (3-2)th and (4-2)th electrodes EL3_2 and EL4_2 may configure the third serial stage SET3 together with the plurality of light emitting elements LD (e.g., LD3) connected in parallel therebetween.

In an embodiment of the disclosure, first to fourth serial stages SET1 to SET4 may be disposed in the pixel area PXA of each pixel PXL, and the first to fourth serial stages SET1 to SET4 may configure the light emitting unit EMU of the pixel PXL.

The (1-1)th electrode EL1_1 included in the first serial stage SET1 may be an anode electrode of the light emitting unit EMU of each pixel PXL, and the (3-1)th electrode EL3_1 included in the fourth serial stage SET4 may be a cathode electrode.

One end of each of the first and fourth electrodes EL1 and EL4 from among the first to fourth electrodes EL1 to EL4 may include a protrusion PRT extending in the first direction DR1. The protrusion PRT of each of the first and fourth electrodes EU and EL4 may be positioned to correspond to the first opening OP1 of the bank BNK. The protrusion PRT of the first electrode EL1 may protrude from the pixel area PXA of each pixel PXL toward the bank BNK in the first direction DR1. The protrusion PRT of the first electrode EL1 may be provided to reduce or minimize the number of misaligned light emitting elements LD by increasing or maximizing a distance between the first electrode EL1 and the second electrode EL2 adjacent to the first electrode EL1 between the first and second emission areas EMA1 and EMA2 of the pixel area PXA. The protrusion PRT of the fourth electrode EL4 may protrude from the pixel area PXA toward the bank BNK in the first direction DR1. The protrusion PRT of the fourth electrode EL4 may be provided to reduce or minimize the number of misaligned light emitting elements LD by increasing or maximizing a distance between the fourth electrode EL4 and the third electrode EL3 adjacent to the fourth electrode EL4 between the first and second emission areas EMA1 and EMA2 of the pixel area PXA. According to an embodiment, even though the protrusions PRT of each of the first and fourth electrodes EL1 and EL4 are provided, at least one misaligned light emitting element LD may be positioned in the pixel area PXA of each pixel PXL. For example, at least one misaligned light emitting element LD may be positioned in the first opening OP1 of the bank BNK.

After the light emitting elements LD are aligned in the pixel area PXA of each pixel PXL, in order to independently (or individually) drive the pixel PXL from adjacent pixels PXL, a portion of each of the first to fourth electrodes EL1 to EL4 positioned between the pixels PXL adjacent in one direction, for example, the second direction DR2 may be removed, and thus an end thereof may be positioned in the second opening OP2 of the bank BNK. After the light emitting elements LD are aligned, another portion of each of the first to fourth electrodes EL1 to EL4 may be removed, and thus each of the first to fourth electrodes EL1 to EL4 may be provided in a form including two electrodes positioned in the same column and spaced from each other. For example, a portion of the first electrode EL1 corresponding to the first opening OP1 of the bank BNK may be removed or disconnected after the alignment of the light emitting elements LD, and thus the first electrode EL1 may be provided in a form including the (1-1)th electrode EL1_1 and the (1-2)th electrode EL1_2 that are positioned in the same column and spaced from each other. A portion of the second electrode EL2 corresponding to the first opening OP1 of the bank BNK may be removed or disconnected after the alignment of the light emitting elements LD, and thus the second electrode EL2 may be provided in a form including the (2-1)th electrode EL2_1 and the (2-2)th electrode EL2_2 that are positioned in the same column and spaced from each other. A portion of the third electrode EL3 corresponding to the first opening OP1 of the bank BNK may be removed or disconnected after the alignment of the light emitting elements LD, and thus the third electrode EL3 may be provided in a form including the (3-1)th electrode EL3_1 and the (3-2)th electrode EL3_2 that are positioned in the same column and spaced from each other. A portion of the fourth electrode EL4 corresponding to the first opening OP1 of the bank BNK may be removed or disconnected after the alignment of the light emitting elements LD, and thus the fourth electrode EL4 may be provided in a form including the (4-1)th electrode EL4_1 and the (4-2)th electrode EL4_2 that are positioned in the same column and spaced from each other.

After the light emitting elements LD are aligned in the pixel area PXA of each pixel PXL, a portion of each of the first to fourth electrodes EL1 to EL4 may be removed, and thus each of the first to fourth electrodes EL1 to EL4 may be provided in a form including two electrodes that are positioned in the same column and spaced from each other. The pixel area PXA may include the first emission area EMA1 and the second emission area EMA2 partitioned according to positions of the two electrodes that are positioned in the same column are spaced from each other. For example, an area where one of the two electrodes positioned in the same column and spaced from each other is positioned may be the first emission area EMA1, and an area where the other electrode is positioned may be the second emission area EMA2. The first emission area EMA1 may be an area in which light is emitted by the (1-1)th to (4-1)th electrodes EL1_1 to EL4_1 and the light emitting elements LD disposed therebetween, and the second emission area EMA2 may be an area in which light is emitted by the (1-2)th to (4-2)th electrodes EL1_2 to EL4_2 and the light emitting elements LD disposed therebetween. The first emission area EMA1 may include the (1-1)th emission area EMA1_1 through which light is emitted by the light emitting elements LD (e.g., LD1) disposed between the (1-1)th and (2-1)th electrodes EL1_1 and EL2_1, and the (1-2)th emission area EMA1_2 through which light is emitted by the light emitting elements LD (e.g., LD4) disposed between the (3-1)th and (4-1)th electrodes EL3_1 and EL4_1. The second emission area EMA2 may include the (2-1)th emission area EMA2_1 in which light is emitted by the light emitting elements LD (e.g., LD2) disposed between the (1-2)th and (2-2)th electrodes EL1_2 and EL2_2, and the (2-2)th emission area EMA2_2 in which light is emitted by the light emitting elements LD (e.g., LD3) disposed between the (3-2)th and (4-2)th electrodes EL3_2 and EL4_2.

Each of the light emitting elements LD may be an ultra-small light emitting diode of, for example, a size as small as a nano scale to a micro scale, using an inorganic crystal structure material. Each of the light emitting elements LD may be an ultra-small light emitting diode manufactured by an etching method or an ultra-small light emitting diode manufactured by a growth method.

At least two to tens of light emitting elements LD may be aligned and/or provided in the pixel area PXA of each pixel PXL, but the number of light emitting elements LD is not limited thereto. According to an embodiment, the number of light emitting elements LD aligned and/or provided in the pixel area PXA may be variously changed.

Each of the light emitting elements LD may emit any one of color light and/or white light. Each of the light emitting elements LD may be aligned on the first insulating layer INS1 between two adjacent electrodes from among the first to fourth electrodes EL1 to EL4 such that the extension direction (or the direction of the length L) is parallel to the first direction DR1 on the plan view or the cross-sectional view. The light emitting elements LD may be provided in a form sprayed in a solution to be input to the pixel area PXA of each pixel PXL.

The light emitting elements LD may be input to the pixel area PXA of each pixel PXL through an inkjet printing method, a slit coating method, or other various methods. For example, the light emitting elements LD may be mixed with a volatile solvent and supplied to the pixel area PXA through an inkjet printing method or a slit coating method. At this time, when an alignment signal corresponding to each of the first to fourth electrodes EL1 to EL4 provided in the pixel area PXA is applied, an electric field may be formed between two adjacent electrodes from among the first to fourth electrodes EL1 to EL4. Therefore, the light emitting elements LD may be aligned between the two adjacent electrodes from among the first to fourth electrodes EL1 to EL4. As described above, because the same alignment signal (or alignment voltage) is applied to each of the second and third electrodes EL2 and EL3, the light emitting elements LD may not be aligned between the second electrode EL2 and the third electrode EL3. However, the disclosure is not limited thereto. According to an embodiment, when the alignment signal is applied to each of the second and third electrodes EL2 and EL3, a potential difference may occur between the alignment signals applied to the second electrode EL2 and the third electrode EL3 due to a line resistance of the two electrodes, influence of an electric field induced between the adjacent electrodes, and the like. In such a case, the light emitting elements LD may be aligned between the second and third electrodes EL2 and EL3.

After the light emitting elements LD are aligned, the light emitting elements LD may be finally aligned and/or provided in the pixel area PXA of each pixel PXL by volatilizing the solvent or removing the solvent in other methods.

In FIG. 5, the light emitting elements LD in which the direction of the length L is parallel to the first direction DR1 are aligned between the two adjacent electrodes from among the first to fourth electrodes EL1 to EL4, but the disclosure is not limited thereto. According to an embodiment, some of the light emitting elements LD in which the direction of the length L is parallel to the second direction DR2 and/or a direction inclined to the second direction DR2 may be aligned between the two adjacent electrodes. In an embodiment, at least one reverse light emitting element LDr connected in a reverse direction may be further disposed between the two adjacent electrodes. According to another embodiment, at least one defective light emitting element positioned in an area other than an area between the two adjacent electrodes and not connected to the two adjacent electrodes, for example, an ineffective light source LD5 may be further disposed. The ineffective light source LD5 may be a misaligned light emitting element positioned in the first opening OP1 of the bank BNK of a corresponding pixel PXL.

In FIG. 5, for convenience, a distance between the two adjacent electrodes from among the first to fourth electrodes EL1 to EL4 is less (or narrower) than the length L of each of the light emitting elements LD disposed between the two electrodes, but the disclosure is not limited thereto. According to an embodiment, the distance between the two electrodes may be greater (or wider) than the length L of each of the light emitting elements LD. For example, a distance between the (1-1)th electrode EL1_1 and the (2-1)th electrode EL2_1 may be less (or narrower) than the length L of each of the light emitting elements LD (e.g., LD1) positioned between the (1-1)th and (2-1)th electrodes EL1_1 and EL2_1, but the disclosure is not limited thereto, and according to an embodiment, the distance between the (1-1)th electrode EL1_1 and the (2-1)th electrode EL2_1 may be less greater (or wider) than the length L of each of the light emitting elements LD (e.g., LD1).

In an embodiment of the disclosure, when the light emitting elements LD are disposed between the two adjacent electrodes from among the first to fourth electrodes EL1 to EL4, the light emitting elements LD may partially overlap the two electrodes on the plan view, but the disclosure is not limited thereto. According to an embodiment, the light emitting elements LD may be disposed between the two electrodes without overlapping each of the two electrodes. For example, the light emitting elements LD (e.g., LD1) disposed between the (1-1)th electrode EL1_1 and the (2-1)th electrode EL2_1 may partially overlap each of the (1-1)th and (2-1)th electrodes EL1_1 and EL2_1, but the disclosure is not limited thereto, and according to an embodiment, the light emitting elements LD (e.g., LD1) may not overlap each of the (1-1)th and (2-1)th electrodes EL1_1 and EL2_1.

In an embodiment of the disclosure, the light emitting elements LD may include a plurality of first light emitting elements LD1, a plurality of second light emitting elements LD2, a plurality of third light emitting elements LD3, and a plurality of fourth light emitting elements LD4.

The first light emitting elements LD1 may be disposed between the (1-1)th electrode EL1_1 and the (2-1)th electrode EL2_1 in the (1-1)th emission area EMA1_1. The second light emitting elements LD2 may be disposed between the (1-2)th electrode EL1_2 and the (2-2)th electrode EL2_2 in the (2-1)th emission area EMA2_1. The third light emitting elements LD3 may be disposed between the (3-2)th electrode EL3_2 and the (4-2)th electrode EL4_2 in the (2-2)th emission area EMA2_2. The fourth light emitting elements LD4 may be disposed between the (3-1)th electrode EL3_1 and the (4-1)th electrode EL4_1 in the (1-2)th emission area EMA1_2.

The first light emitting elements LD1 may be aligned in the same direction between the (1-1)th electrode EL1_1 and the (2-1)th electrode EL2_1. For example, one end of each of the first light emitting elements LD1 may be connected to the (1-1)th electrode EL1_1, and another end of each of the first light emitting elements LD1 may be connected to the (2-1)th electrode EL2_1. In an embodiment of the disclosure, the (1-1)th electrode EL1_1 and the (2-1)th electrode EL2_1 may configure the first serial stage SET1 together with the first light emitting elements LD1 connected in parallel in the same direction between the (1-1)th electrode EL1_1 and the (2-1)th electrode EL2_1.

The second light emitting elements LD2 may be aligned in the same direction between the (1-2)th electrode EL1_2 and the (2-2)th electrode EL2_2. For example, one end of each of the second light emitting elements LD2 may be connected to the (1-2)th electrode EL1_2, and another end of each of the second light emitting element LD2 may be connected to the (2-2)th electrode EL2_2. The (1-2)th electrode EL1_2 and the (2-2)th electrode EL2_2 may configure the second serial stage SET2 together with the second light emitting elements LD2 connected in parallel in the same direction between the (1-2)th electrode EL1_2 and the (2-2)th electrode EL2_2.

The third light emitting elements LD3 may be aligned in the same direction between the (4-2)th electrode EL4_2 and the (3-2)th electrode EL3_2. For example, one end of each of the third light emitting elements LD3 may be connected to the (4-2)th electrode EL4_2, and another end of each of the third light emitting elements LD3 may be connected to the (3-2)th electrode EL3_2. The (4-2)th electrode EL4_2 and the (3-2)th electrode EL3_2 may configure the third serial stage SET3 together with the third light emitting elements LD3 connected in parallel in the same direction between the (4-2)th electrode EL4_2 and the (3-2)th electrode EL3_2.

The fourth light emitting elements LD4 may be aligned in the same direction between the (4-1)th electrode EL4_1 and the (3-1)th electrode EL3_1. For example, one end of each of the fourth light emitting elements LD4 may be connected to the (4-1)th electrode EL4_1, and another end of each of the fourth light emitting elements LD4 may be connected to the (3-1)th electrode EL3_1. The (4-1)th electrode EL4_1 and the (3-1)th electrode EL3_1 may configure the fourth serial stage SET4 together with the fourth light emitting elements LD4 connected in parallel in the same direction between the (4-1)th electrode EL4_1 and the (3-1)th electrode EL3_1.

The first to fourth light emitting elements LD1 to LD4 described above may be provided and/or formed on the first insulating layer INS1.

The first insulating layer INS1 may include an inorganic insulating layer formed of an inorganic material or an organic insulating layer formed of an organic material. In an embodiment of the disclosure, the first insulating layer INS1 may be formed of an inorganic insulating layer that is suitable for protecting the light emitting elements LD from the pixel circuit layer PCL of each pixel PXL. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. According to an embodiment, the first insulating layer INS1 may be formed of an organic insulating layer that is suitable for planarizing a support surface of the light emitting elements LD.

The first insulating layer INS1 may include a first via hole VIH1 exposing one region of the (1-1)th electrode EL1_1 and a second via hole VIH2 exposing one region of the (3-1)th electrode EL3_1. The first insulating layer INS1 may cover regions other than the one region of the (1-1)th electrode EL1_1 and the one region of the (3-1)th electrode EL3_1.

The second insulating layers INS2 may be provided and/or formed on each of the light emitting elements LD. The second insulating layer INS2 may be provided and/or formed on the light emitting elements LD, partially cover an outer surface (e.g., an outer peripheral surface or an outer circumferential surface (or surface)) of each of the light emitting elements LD, and expose the both ends of each of the light emitting elements LD to the outside.

The second insulating layer INS2 may be configured of a single layer or multiple layers, and may include an inorganic insulating layer including at least one inorganic material or an organic insulating layer including at least one organic material. The second insulating layer INS2 may further fix each of the light emitting elements LD. The second insulating layer INS2 may include an inorganic insulating layer that is suitable for protecting each active layer 12 of the light emitting elements LD from external oxygen and moisture, and the like. However, the disclosure is not limited thereto. The second insulating layer INS2 may be configured of an organic insulating layer including an organic material according to a design condition or the like of the display device to which the light emitting elements LD are applied.

In an embodiment of the disclosure, by forming the second insulating layer INS2 on the light emitting elements LD after the alignment of the light emitting elements LD is completed in the pixel area PXA of each of the pixels PXL, the light emitting elements LD may be prevented from deviating from an aligned position. When an empty gap (or space) is present between the first insulating layer INS1 and the light emitting elements LD before forming the second insulating layer INS2, the empty gap may be filled with the second insulating layer INS2 in a process of forming the second insulating layer INS2. Accordingly, the second insulating layer INS2 may be configured of an organic insulating layer that is suitable for filling the empty gap between the first insulating layer INS1 and the light emitting elements LD.

The first and second contact electrodes CNE1 and CNE2 and the first to third intermediate electrodes CTE1 to CTE3 may be provided and/or formed on the first to fourth electrodes EL1 to EL4.

The first and second contact electrodes CNE1 and CEN2 and the first to third intermediate electrodes CTE1 to CTE3 may be configurations that more stably electrically connect the first to fourth electrodes EL1 to EL4 and the light emitting elements LD.

The first contact electrode CNE1 may be provided and/or formed on the (1-1)th electrode EL1_1. The first contact electrode CNE1 may directly contact the (1-1)th electrode EL1_1 through the first via hole VIH1 to be connected to the (1-1)th electrode EL1_1. According to an embodiment, when a capping layer is disposed on the (1-1)th electrode EL1_1, the first contact electrode CNE1 may be disposed on the capping layer and may be connected to the (1-1)th electrode EL1_1 through the capping layer. The above-described capping layer may protect the (1-1)th electrode EL1_1 from a defect or the like generated during a manufacturing process of the display device, and may further reinforce adhesion between the (1-1)th electrode EL1_1 and the pixel circuit layer PCL positioned under the (1-1)th electrode EL1_1. The capping layer may include a transparent conductive material (or substance) such as indium zinc oxide (IZO).

In an embodiment, the first contact electrode CNE1 may be provided and/or formed on the one end of each of the first light emitting elements LD1 to be connected to the one end of each of the first light emitting elements LD1. Accordingly, the (1-1)th electrode EL1_1 and the one end of each of the first light emitting elements LD1 may be electrically connected to each other through the first contact electrode CNE1.

The second contact electrode CNE2 may be provided and/or formed on the (3-1)th electrode EL3_1. The second contact electrode CNE2 may directly contact the (3-1)th electrode EL3_1 through the second via hole VIH2 to be connected to the (3-1)th electrode EL3_1. According to an embodiment, when a capping layer is disposed on the second electrode EL2, the second contact electrode CNE2 may be disposed on the capping layer and connected to the (3-1)th electrode EL3_1 through the capping layer.

In an embodiment, the second contact electrode CNE2 may be provided and/or formed on another end of each of the fourth light emitting elements LD4 to be connected to the other end of each of the fourth light emitting elements LD4. Accordingly, the (3-1)th electrode EL3_1 and the other end of each of the fourth light emitting elements LD4 may be electrically connected to each other through the second contact electrode CNE2.

The first and second contact electrodes CNE1 and CNE2 may be configured of various transparent conductive materials in order to cause light emitted from each of the light emitting elements LD and reflected by the (1-1)th and (3-1)th electrodes EL1_1 and EL3_1 to progress in the image display direction of the display device without loss. For example, the first and second contact electrodes CNE1 and CNE2 may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and may be configured to be substantially transparent or translucent to satisfy a suitable transmittance (e.g., a set or predetermined transmittance). However, the material of the first and second contact electrodes CNE1 and CNE2 is not limited to the above-described embodiment. According to an embodiment, the first and second contact electrodes CNE1 and CNE2 may be configured of various opaque conductive materials (or substances). The first and second contact electrodes CNE1 and CNE2 may be formed of a single layer or multiple layers.

On the plan view, each of the first and second contact electrodes CNE1 and CNE2 may have a bar shape extending in the second direction DR2, but the disclosure is not limited thereto. According to an embodiment, the shape of the first and second contact electrodes CNE1 and CNE2 may be variously changed within a range in which the first and second contact electrodes CNE1 and CNE2 are electrically connected to each of the light emitting elements LD stably. In an embodiment, the shape of each of the first and second contact electrodes CNE1 and CNE2 may be variously changed in consideration of a connection relationship with electrodes disposed under each of the first and second contact electrodes CNE1 and CNE2.

The first to third intermediate electrodes CTE1 to CTE3 may be electrodes to which a signal (e.g., a set or predetermined signal (or voltage)) is not directly transferred from the outside.

The first intermediate electrode CTE1 may be provided on each of the (2-1)th electrode EL2_1 and the (1-2)th electrode EL1_2, and may overlap the (2-1)th and (1-2)th electrodes EL2_1 and EL1_2 on the plan view. On the plan view, the first intermediate electrode CTE1 may be provided in a form in which the first intermediate electrode CTE1 crosses between the first and second emission areas EMA1 and EMA2 from the first emission area EMA1 of each pixel PXL and extends to the second emission area EMA2. Here, an area between the first and second light emitting areas EMA1 and EMA2 may correspond to the first opening OP1 of the bank BNK. In an embodiment of the disclosure, the first opening OP1 is partitioned by the emission area EMA and the bank BNK, but the disclosure is not limited thereto. According to an embodiment, the first opening OP1 may be included in the emission area EMA. In other words, the emission area EMA and the first opening OP1 may be integrally provided.

The first intermediate electrode CTE1 may be disposed on the first insulating layer INS1 on the (2-1)th and (1-2)th electrodes EL2_1 and EL1_2 and may be electrically insulated from the (2-1)th and (1-2)th electrodes EL2_1 and EL1_2.

The first intermediate electrode CTE1 may be disposed on the other end of each of the first light emitting elements LD1 in the first emission area EMA1 of each pixel PXL and may be electrically and/or physically connected to the first light emitting elements LD1. In an embodiment, the first intermediate electrode CTE1 may be disposed on one end of each of the second light emitting elements LD2 in the second emission area EMA2 of a corresponding pixel PXL and may be electrically and/or physically connected to the second light emitting elements LD2. The first intermediate electrode CTE1 may function as a first bridge electrode (or a first connection electrode) connecting the first light emitting elements LD1 and the second light emitting elements LD2. In other words, the first intermediate electrode CTE1 may be the first bridge electrode (or the first connection electrode) connecting the first serial stage SET1 and the second serial stage SET2.

The first intermediate electrode CTE1 may be provided to overlap the (2-1)th electrode EL2_1, the first opening OP1 of the bank BNK, and the (1-2)th electrode EL1_2, and may have a bar shape that is bent at least once, but the disclosure is not limited thereto. According to an embodiment, the first intermediate electrode CTE1 may be changed into various shapes within a range stably connecting the continuous first serial stage SET1 and second serial stage SET2.

The second intermediate electrode CTE2 may be provided on each of the (2-2)th electrode EL2_2 and the (4-2)th electrode EL4_2, and may overlap the (2-2)th and (4-2)th electrodes EL2_2 and EL4_2 on the plan view. On the plan view, the second intermediate electrode CTE2 may be provided in the second emission area EMA2 of each pixel PXL.

The second intermediate electrode CTE2 may be disposed on the first insulating layer INS1 on the (2-2)th electrode EL2_2 and the (4-2)th electrode EL4_2 and may be electrically insulated from the (2-2)th and (4-2)th electrodes EL2_2 and EL4_2.

The second intermediate electrode CTE2 may be disposed on another end of each of the second light emitting elements LD2 in the second emission area EMA2 of each pixel PXL and may be electrically and/or physically connected to the second light emitting elements LD2. In an embodiment, the second intermediate electrode CTE2 may be disposed on one end of the third light emitting elements LD3 in the second emission area EMA2 and may be electrically and/or physically connected to the third light emitting elements LD3. The second intermediate electrode CTE2 may function as a second bridge electrode (or a second connection electrode) connecting the second light emitting elements LD2 and the third light emitting elements LD3. In other words, the second intermediate electrode CTE2 may be the second bridge electrode (or the second connection electrode) connecting the second serial stage SET2 and the third serial stage SET3.

The second intermediate electrode CTE2 may be provided to overlap the (2-2)th and (4-2)th electrodes EL2_2 and EL4_2 and may have a closed circuit shape that is bent at least once and at least partially opened, but the disclosure is not limited thereto. According to an embodiment, the second intermediate electrode CTE2 may be changed into various shapes within a range stably connecting the continuous second serial stage SET2 and third serial stage SET3.

The third intermediate electrode CTE3 may be provided on each of the (3-2)th electrode EL3_2 and the (4-1)th electrode EL4_1, and may overlap the (3-2)th and (4-1)th electrodes EL3_2 and EL4_1 on the plan view. On the plan view, the third intermediate electrode CTE3 may be provided in a form in which the third intermediate electrode CTE3 crosses between the second and first emission areas EMA2 and EMA1 from the second emission area EMA2 of each pixel PXL and extends to the first emission area EMA1. Here, an area between the second and first emission areas EMA2 and EMA1 may correspond to the first opening OP1 of the bank BNK.

The third intermediate electrode CTE3 may be disposed on the first insulating layer INS1 on the (3-2)th and (4-1)th electrodes EL3_2 and EL4_1 and may be electrically insulated from the (3-2)th and (4-1)th electrodes EL3_2 and EL4_1.

The third intermediate electrode CTE3 may be disposed on another end of each of the third light emitting elements LD3 in the second emission area EMA2 of each pixel PXL and may be electrically and/or physically connected to the third light emitting elements LD3. In an embodiment, the third intermediate electrode CTE3 may be disposed on one end of each of the fourth light emitting elements LD4 in the first emission area EMA1 of a corresponding pixel PXL and may be electrically and/or physically connected to the fourth light emitting elements LD4. The third intermediate electrode CTE3 may function as a third bridge electrode (or a third connection electrode) connecting the third light emitting elements LD3 and the fourth light emitting elements LD4. In other words, the third intermediate electrode CTE3 may be the third bridge electrode (or the third connection electrode) connecting the third serial stage SET3 and the fourth serial stage SET4.

The third intermediate electrode CTE3 may be provided to overlap the (3-2)th electrode EL3_2, the first opening OP1 of the bank BNK, and the (4-1)th electrode EL4_1, and may have a bar shape that is bent at least once, but the disclosure is not limited thereto. According to an embodiment, the third intermediate electrode CTE3 may be changed into various shapes within a range stably connecting the continuous third serial stage SET3 and fourth serial stage SET4.

In the pixel area PXA of each of the pixels PXL, the first and second contact electrodes CNE1 and CNE2 and the first to third intermediate electrodes CTE1 to CTE3 may be spaced from each other on the plan view and the cross-sectional view.

The first contact electrode CNE1 may face one region of the first intermediate electrode CTE1. One region of the first contact electrode CNE1 and the first intermediate electrode CTE1 may extend in the same direction, for example, in the second direction DR2. The one region of the first contact electrode CNE1 and the first intermediate electrode CTE1 may be spaced in the first direction DR1.

Another region of the first intermediate electrode CTE1 may face one region of the second intermediate electrode CTE2. The other region of the first intermediate electrode CTE1 and the one region of the second intermediate electrode CTE2 may extend in the second direction DR2. The other region of the first intermediate electrode CTE1 and the one region of the second intermediate electrode CTE2 may be spaced in the first direction DR1.

Another region of the second intermediate electrode CTE2 may face one region of the third intermediate electrode CTE3. The other region of the second intermediate electrode CTE2 and the one region of the third intermediate electrode CTE3 may extend in the second direction DR2. The other region of the second intermediate electrode CTE2 and the one region of the third intermediate electrode CTE3 may be spaced in the first direction DR1.

Another region of the third intermediate electrode CTE3 may face the second contact electrode CNE2. The other region of the third intermediate electrode CTE3 and the second contact electrode CNE2 may extend in the second direction DR2. The other region of the third intermediate electrode CTE3 and the second contact electrode CNE2 may be spaced in the first direction DR1.

The first to third intermediate electrodes CTE1 to CTE3 may be configured of various transparent conductive materials in order to cause the light emitted from each of the light emitting elements LD and reflected by the first to fourth electrodes EL1 to EL4 to progress in the image display direction of the display device without loss.

The first to third intermediate electrodes CTE1 to CTE3 may be provided at the same layer as the first and second contact electrodes CNE1 and CNE2 and formed through the same process as the first and second contact electrodes CNE1 and CNE2. For example, the first to third intermediate electrodes CTE1 to CTE3 and the first and second contact electrodes CNE1 and CNE2 may be provided and/or formed on the second insulating layer INS2. However, the disclosure is not limited thereto, and according to an embodiment, the first to third intermediate electrodes CTE1 to CTE3 may be provided on a layer different from that of the first and second contact electrodes CNE1 and CNE2, and may be formed through a process different from that of the first and second contact electrodes CNE1 and CNE2. In this case, as shown in FIG. 8, an auxiliary insulating layer AUINS may be provided and/or formed between the first contact electrode CNE1 and the first intermediate electrode CTE1 and between the second contact electrode CNE2 and the third intermediate electrode CTE3. The auxiliary insulating layer AUINS may be provided on each of the first and second contact electrodes CNE1 and CNE2 to cover the first and second contact electrodes CNE1 and CNE2. At this time, the auxiliary insulating layer AUINS may include the same material as the first and second insulating layers INS1 and INS2, or may include at least one or more selected from the materials discussed with respect to the first and second insulating layers INS1 and INS2. For example, the auxiliary insulating layer AUINS may be configured of an inorganic insulating layer including an inorganic material or an organic insulating layer including an organic material. As described above, when the auxiliary insulating layer AUINS is disposed on the first and second contact electrodes CNE1 and CNE2, the first to third intermediate electrodes CTE1 to CTE3 may be provided on the auxiliary insulating layer AUINS.

The third insulating layer INS3 may be provided and/or formed on the first and second contact electrodes CNE1 and CNE2 and the first to third intermediate electrodes CTE1 to CTE3. The third insulating layer INS3 may be an inorganic insulating layer including an inorganic material or an organic insulating layer including an organic material. For example, the third insulating layer INS3 may have a structure in which at least one inorganic insulating layer or at least one organic insulating layer is alternately stacked. The third insulating layer INS3 may entirely cover the display element layer DPL to block input of water, moisture, or the like to the display element layer DPL including the light emitting elements LD.

According to an embodiment, the display element layer DPL may be configured to selectively further include an optical layer in addition to the third insulating layer INS3. The third insulating layer INS3 may include a color conversion layer including color conversion particles that convert the light emitted from the light emitting elements LD into light of a specific color.

Assuming that the driving current flows from the first power line PL1 to the driving voltage line DVL by the driving transistor Tdr of the pixel circuit layer PCL included in each pixel PXL, the driving current may flow into the light emitting unit EMU of each pixel PXL through the first contact hole CH1.

For example, the driving current is supplied to the (1-1)th electrode EL1_1 through the first contact hole CH1, and the driving current flows to the first intermediate electrode CTE1 via the first light emitting elements LD1 through the first contact electrode CNE1 directly contacting (or connected to) the (1-1)th electrode EL1_1 through the first via hole VIH1. Accordingly, the first light emitting elements LD1 may emit light at a luminance corresponding to a current divided to each of the first light emitting elements LD1 in the first serial stage SET1.

The driving current flowing to the first intermediate electrode CTE1 flows to the second intermediate electrode CTE2 via the first intermediate electrode CTE1 and the second light emitting elements LD2. Accordingly, the second light emitting elements LD2 may emit light at a luminance corresponding to a current divided to each of the second light emitting elements LD2 in the second serial stage SET2.

The driving current flowing to the second intermediate electrode CTE2 flows to the third intermediate electrode CTE3 via the second intermediate electrode CTE2 and the third light emitting elements LD3. Accordingly, the third light emitting elements LD3 may emit light at a luminance corresponding to a current divided to each of the third light emitting elements LD3 in the third serial stage SET3.

The driving current flowing to the third intermediate electrode CTE3 flows to the second contact electrode CNE2 via the third intermediate electrode CTE3 and the fourth light emitting elements LD4. Accordingly, the fourth light emitting elements LD4 may emit light at a luminance corresponding to a current divided to each of the fourth light emitting elements LD4.

In the above-described method, the driving current of each pixel PXL may flow sequentially through the first light emitting elements LD1 of the first serial stage SET1, the second light emitting elements LD2 of the second serial stage SET2, the third light emitting elements LD3 of the third serial stage SET3, and the fourth light emitting elements LD4 of the fourth serial stage SET4. Accordingly, each pixel PXL may emit light at a luminance corresponding to a data signal supplied during each frame period.

The first contact electrode CNE1 and the first intermediate electrode CTE1 may configure the first serial stage SET1 together with the first light emitting elements LD1, the (1-1)th electrode EL1_1, and the (2-1)th electrode EL2_1. The first intermediate electrode CTE1 and the second intermediate electrode CTE2 may configure the second serial stage SET2 together with the second light emitting elements LD2, the (1-2)th electrode EL1_2, and the (2-2)th electrode EL2_2. The second intermediate electrode CTE2 and the third intermediate electrode CTE3 may configure the third serial stage SET3 together with the third light emitting elements LD3, the (4-2)th electrode EL4_2, and the (3-2)th electrode EL3_2. The third intermediate electrode CTE3 and the second contact electrode CNE2 may configure the fourth serial stage SET4 together with the fourth light emitting element LD4, the (4-1)th electrode EL4_1, and the (3-1)th electrode EL3_1.

In an embodiment, in the first opening OP1 of the bank BNK, at least one fifth light emitting element LD5, which is an ineffective light source, and a dummy conductive pattern CP overlapping the fifth light emitting element LD5 may be disposed. The fifth light emitting element LD5 and the dummy conductive pattern CP are described later with reference to FIG. 12.

Figure 9:
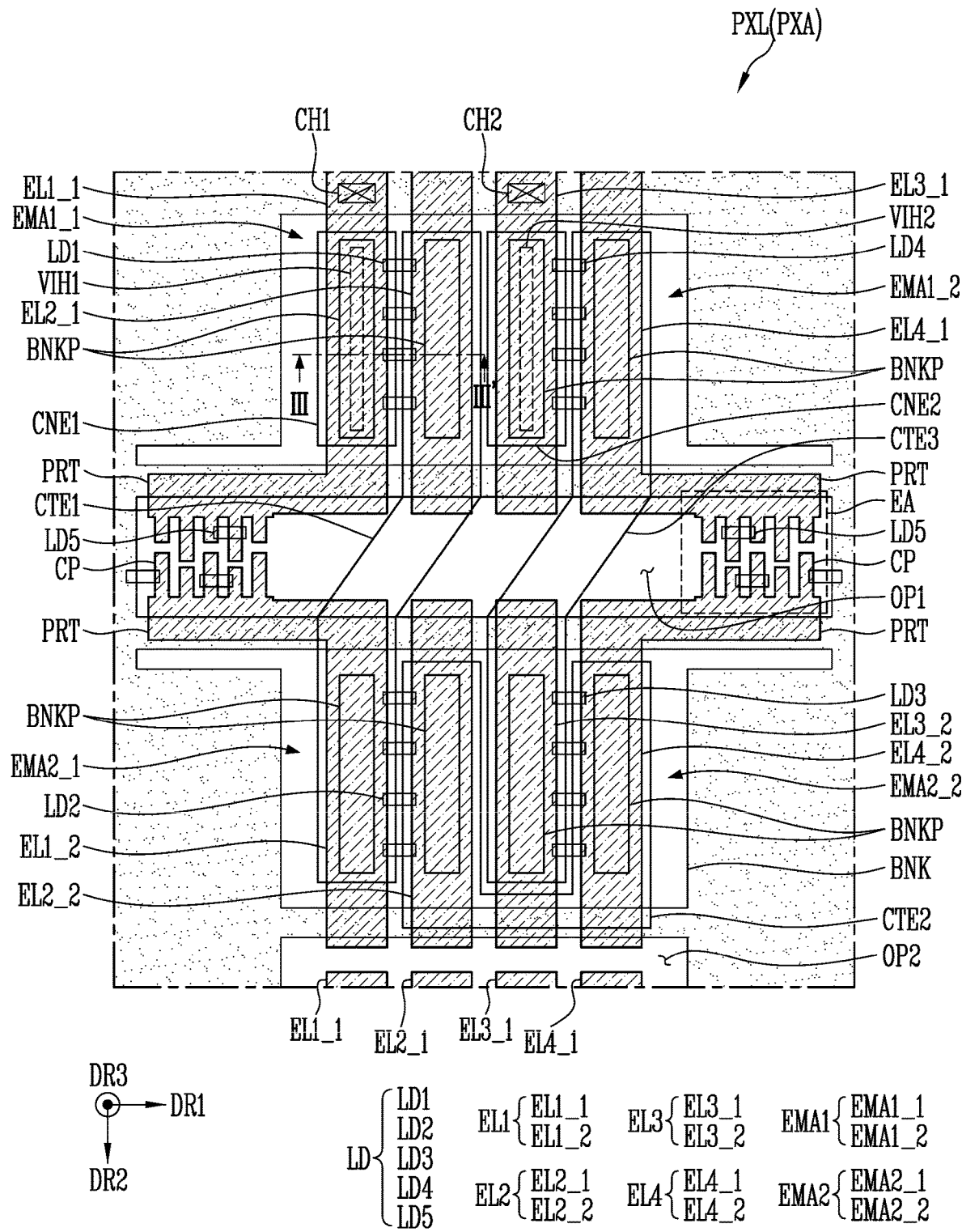
FIG. 9 is a plan view schematically illustrating a pixel according to another embodiment of the disclosure.
Figure 10:
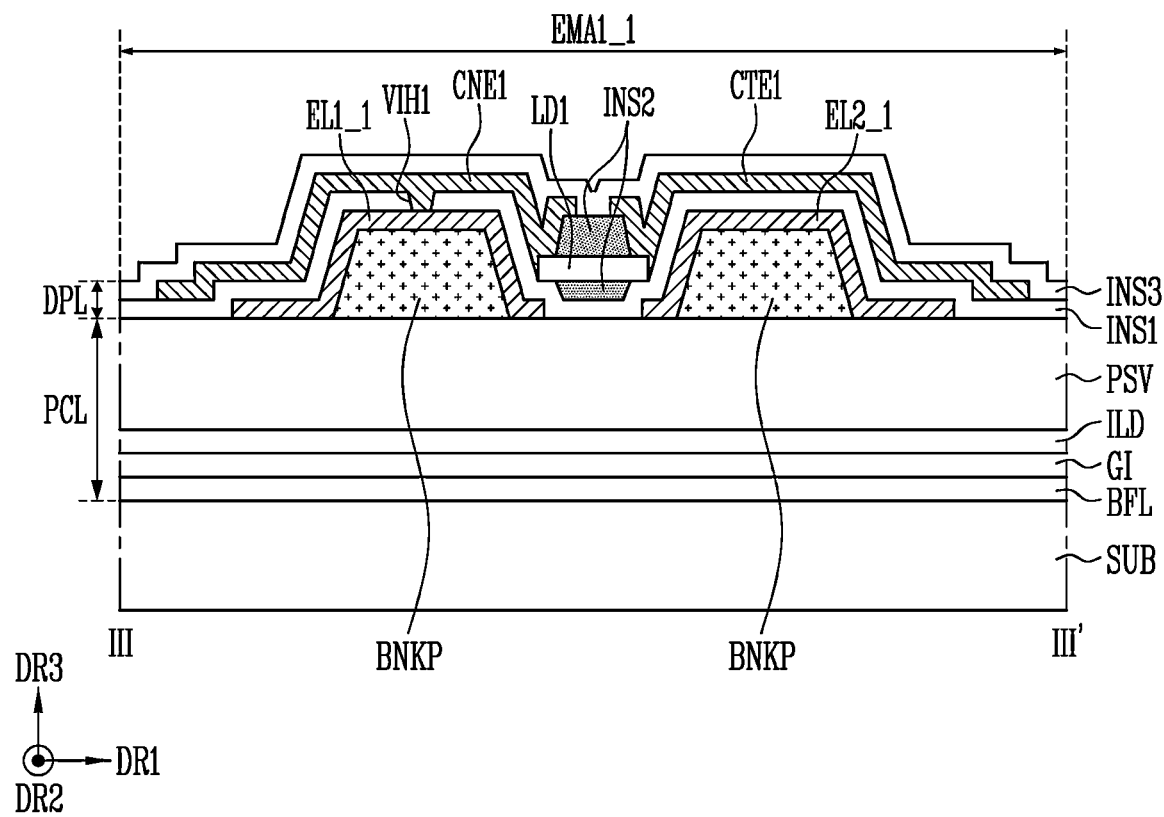
FIG. 10 is a cross-sectional view taken along the line III~III' of FIG. 9.
Figure 11:
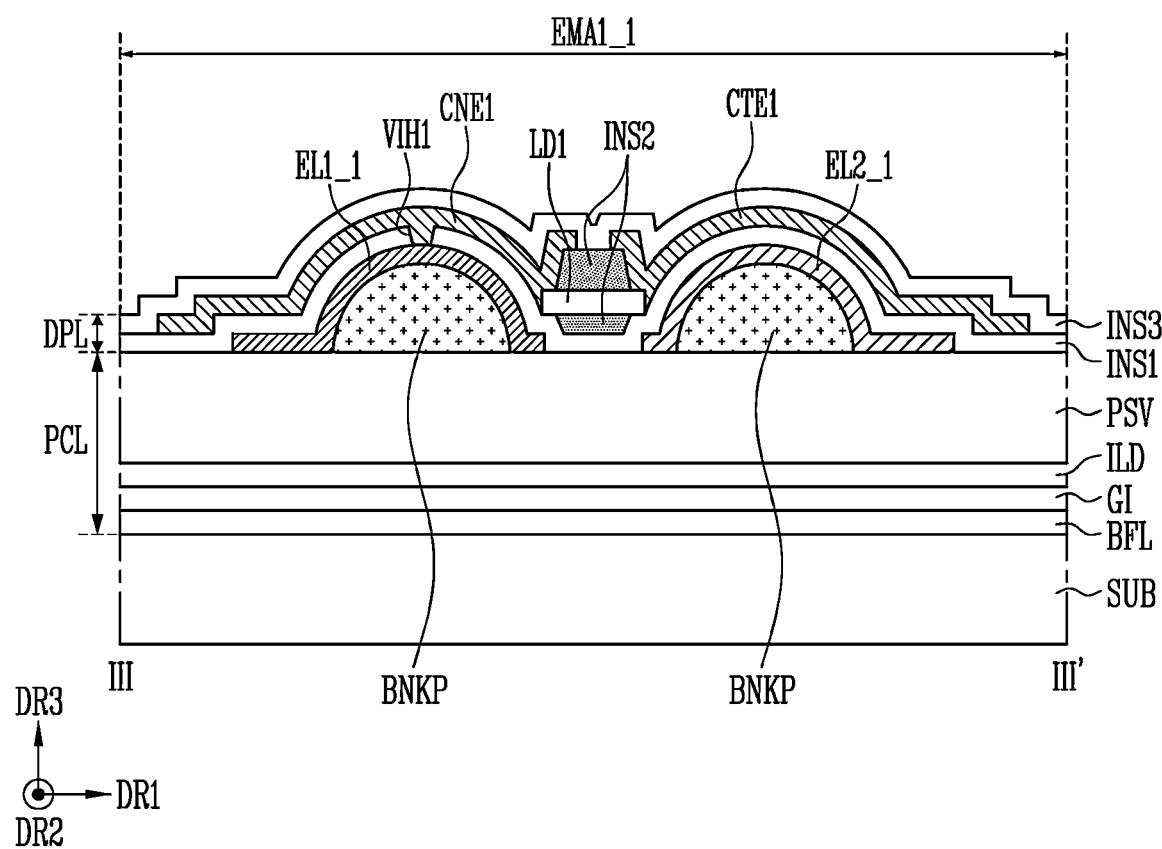
FIG. 11 is a cross-sectional view corresponding to the line III~III' of FIG. 9 as implementation of a bank pattern of FIG. 10 according to another embodiment.

FIG. 9 is a plan view schematically illustrating a pixel according to another embodiment of the disclosure, FIG. 10 is a cross-sectional view taken along the line III~III' of FIG. 9, and FIG. 11 is a cross-sectional view corresponding to the line III~III' of FIG. 9 as implementation of a bank pattern of FIG. 10 according to another embodiment.

The pixel shown in FIGS. 9-11 may have a configuration substantially the same as or similar to the pixel shown in FIGS. 5-7 except that a bank pattern BNKP is disposed between the passivation layer PSV and each of the first to fourth electrodes EL1 to EL4.

Accordingly, regarding the pixel of FIGS. 9-11, differences from that of the above-described embodiment of FIG. 5-8 is mainly described to avoid a repetitive description.

Referring to FIGS. 9-11, a support member may be positioned between each of the first to fourth electrodes EL1 to EL4 and the passivation layer PSV. For example, as shown in FIGS. 9, 10, and 11, the bank pattern BNKP may be positioned between each of the first to fourth electrodes EL1 to EL4 and the passivation layer PSV.

The bank pattern BNKP may be positioned in the first and second emission areas EMA1 and EMA2 where the light is emitted in the pixel area PXA of each pixel PXL. The bank pattern BNKP may be a support member supporting the first to fourth electrodes EL1 to EL4 so as to change a surface profile (or shape) of each of the first to fourth electrodes EL1 to EL4 to guide the light emitted from the light emitting elements LD in the image display direction of the display device.

The bank pattern BNKP may be provided between the passivation layer PSV and the first to fourth electrodes EL1 to EL4 in the first and second emission areas EMA1 and EMA2 of a corresponding pixel PXL.

The bank pattern BNKP may be an inorganic insulating layer including an inorganic material or an organic insulating layer including an organic material. According to an embodiment, the bank pattern BNKP may include an organic insulating layer of a single layer and/or an inorganic insulating layer of a single layer, but the disclosure is not limited thereto. According to an embodiment, the bank pattern BNKP may be provided in a form of multiple layers in which at least one organic insulating layer and at least one inorganic insulating layer are stacked. However, the material of the bank pattern BNKP is not limited to the above-described embodiment, and according to an embodiment, the bank pattern BNKP may include a conductive material.

The bank pattern BNKP may have a cross-section of a trapezoid shape in which a width becomes narrower from one surface (for example, an upper surface) of the passivation layer PSV toward an upper portion in the third direction DR3, but the disclosure is not limited thereto. According to an embodiment, as shown in FIG. 11, the bank pattern BNKP may include a curved surface having a cross-section of a semi-elliptical shape, a semi-circular shape (or a hemispherical shape), or the like in which a width becomes narrower from one surface of the passivation layer PSV toward an upper portion in the third direction DR3. On the cross-sectional view, the shape of the bank pattern BNKP is not limited to the above-described embodiments and may be variously changed within a range capable of improving efficiency of the light emitted from each of the light emitting elements LD. On the plan view, the bank pattern BNKP may have a bar shape extending along the second direction DR2, but the disclosure is not limited thereto.

Each of the first to fourth electrodes EL1 to EL4 may be provided and/or formed on the bank pattern BNKP. Accordingly, because each of the first to fourth electrodes EL1 to EL4 has the surface profile corresponding to the shape of the bank pattern BNKP disposed thereunder, the light emitted from the light emitting elements LD may be reflected by each of the first to fourth electrodes EL1 to EL4 and may further progress in the image display direction of the display device. The bank pattern BNKP and each of the first to fourth electrodes EL1 to EL4 may function as a reflective member that guides the light emitted from the light emitting elements LD in a desired direction to improve light efficiency of the display device. Accordingly, light emission efficiency of the light emitting elements LD may be further improved.

According to the above-described embodiment, in a step of forming the first contact electrode CNE1 of the first serial stage SET1 and the second contact electrode CNE2 of the fourth serial stage SET4, first intermediate electrode CTE1 connecting the first serial stage SET1 and the second serial stage SET2, the second intermediate electrode CTE2 connecting the second serial stage SET2 and the third serial stage SET3, and the third intermediate electrode CTE3 connecting the third serial stage SET3 and the fourth serial stage SET4 may be concurrently formed (e.g., simultaneously formed). Accordingly, a manufacturing process of each pixel PXL and the display device including the same may be simplified, thereby improving a product yield.

According to the above-described embodiment, while reducing or minimizing the area occupied by the alignment electrode (or without increasing the number of alignment electrodes), the light emitting unit EMU may be configured in the serial/parallel mixed structure including the four serial stages SET1 to SET4, and thus a display device of high resolution and fine pitch may be implemented.

Further, according to the above-described embodiment, by configuring the light emitting unit EMU of the serial/parallel mixed structure, each pixel PXL may be stably driven to reduce the driving current flowing through the display panel of the display device, thereby improving power consumption efficiency.

Figure 12:
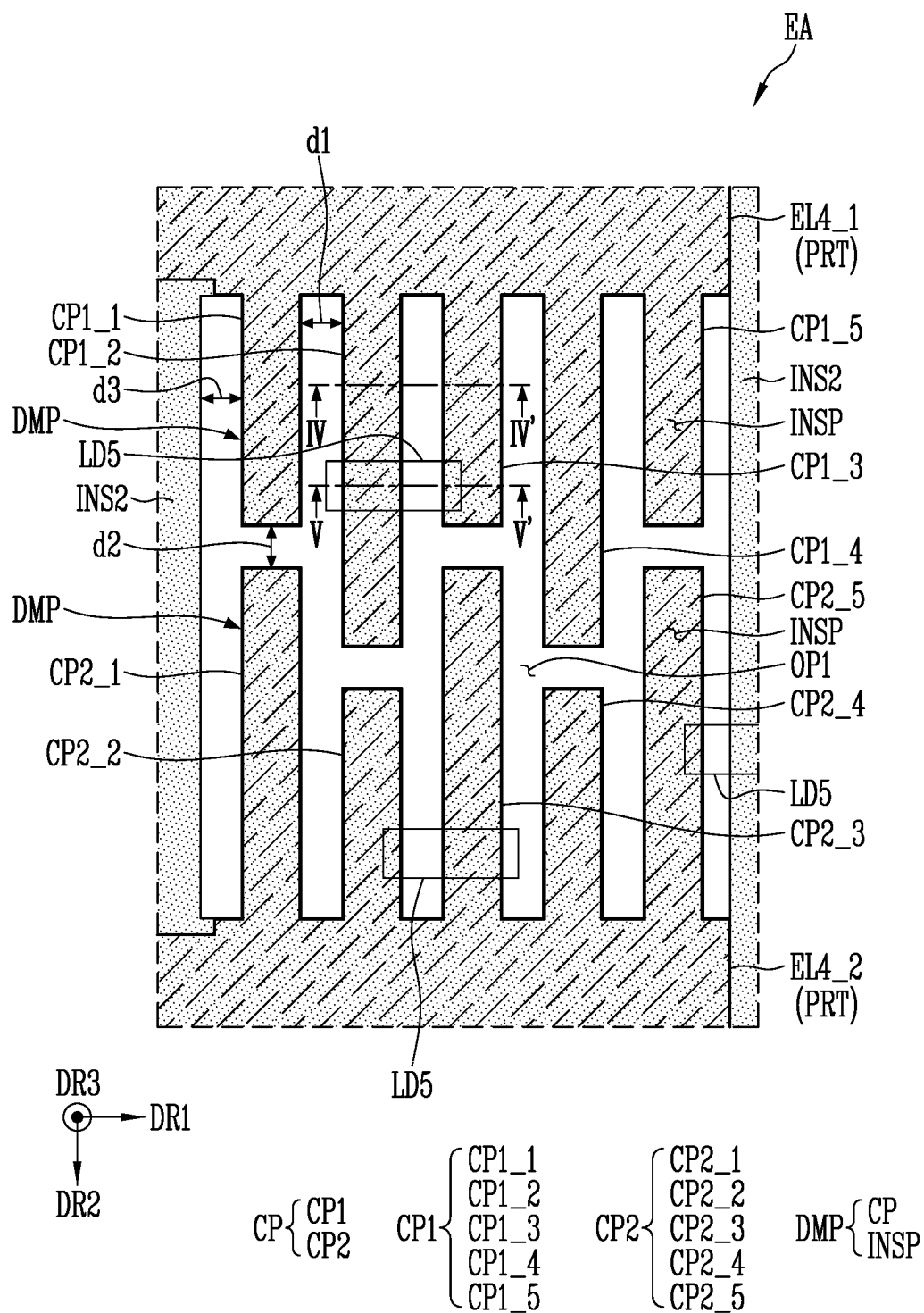
FIG. 12 is a schematic plan view of an enlarged region EA of FIG. 5.
Figure 13A:
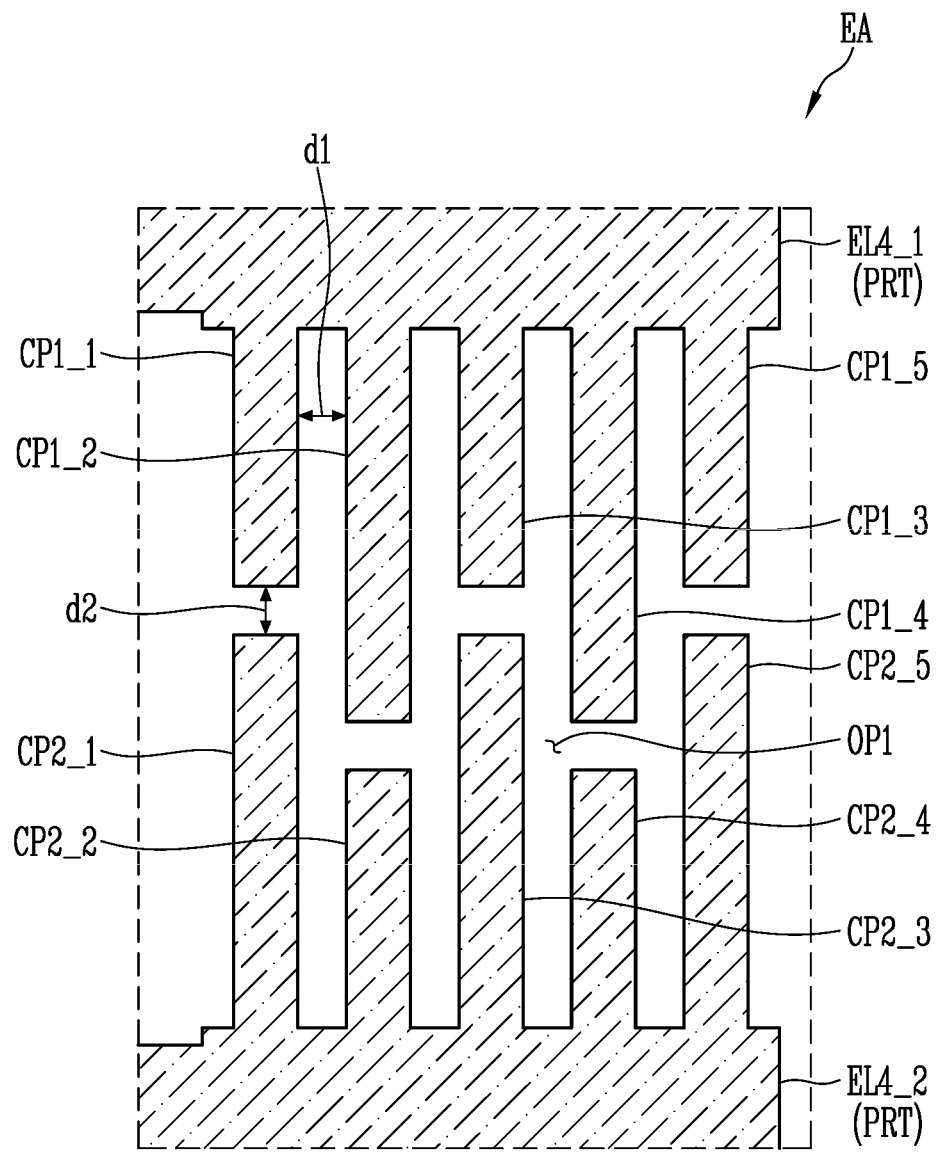
FIG. 13A is a schematic plan view illustrating only a dummy conductive pattern, a (4-1)th electrode, and a (4-2)th electrode of FIG. 12.
Figure 13B:
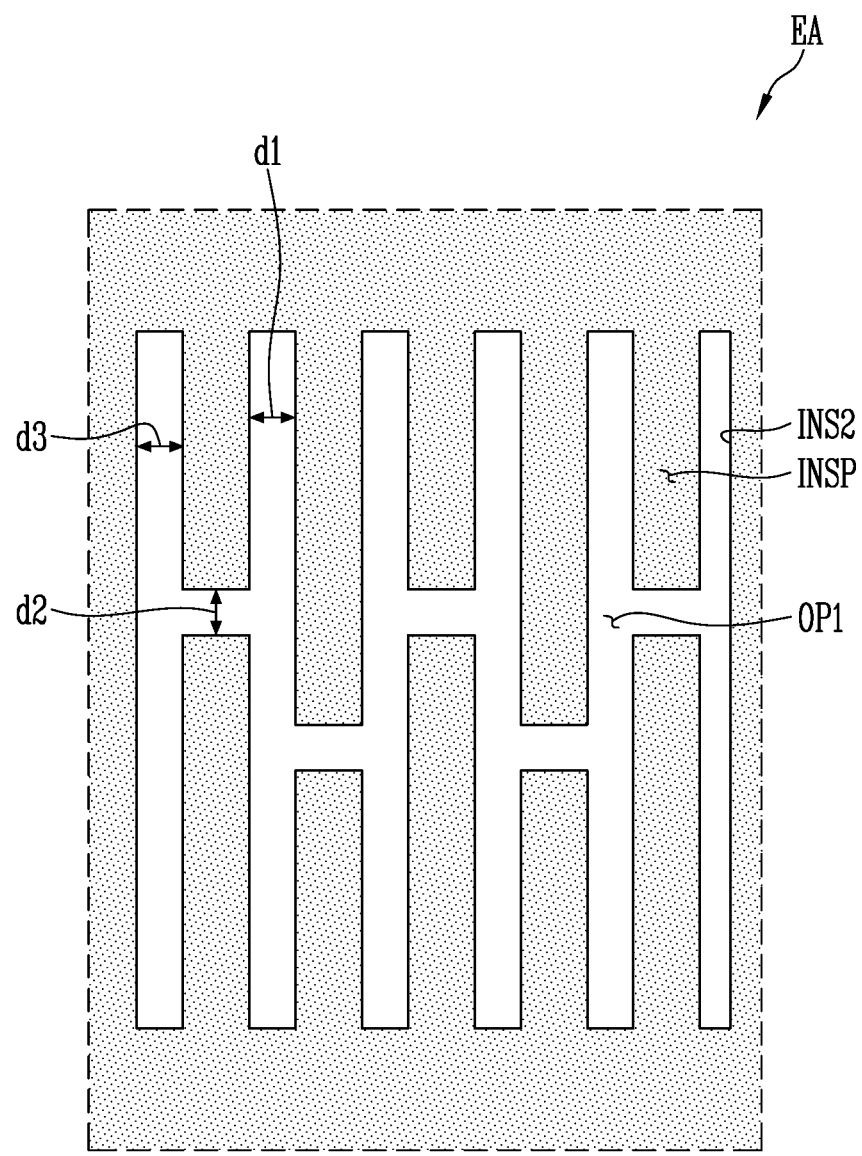
FIG. 13B is a schematic plan view illustrating only a second insulating layer and a dummy insulating pattern of FIG. 12.
Figure 14A:
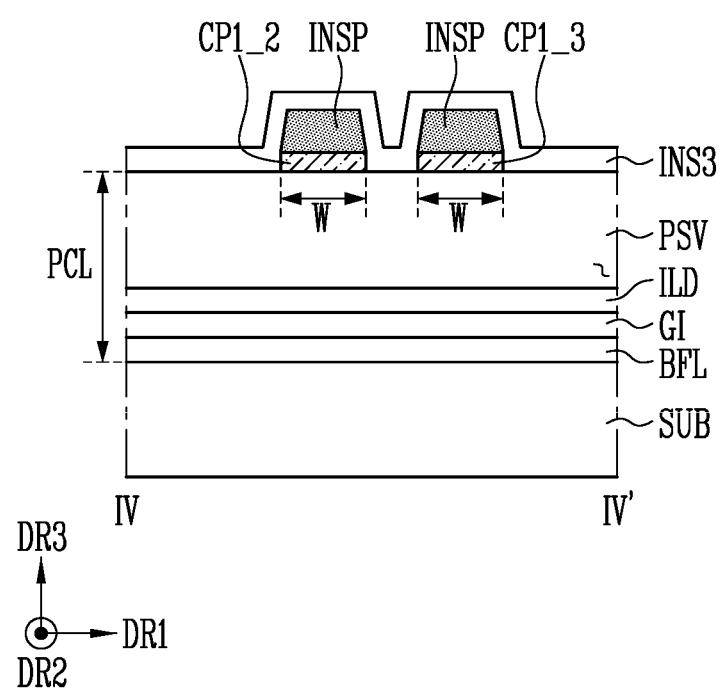
FIG. 14A is a schematic cross-sectional view taken along the line IV~IV' of FIG. 12.
Figure 14B:
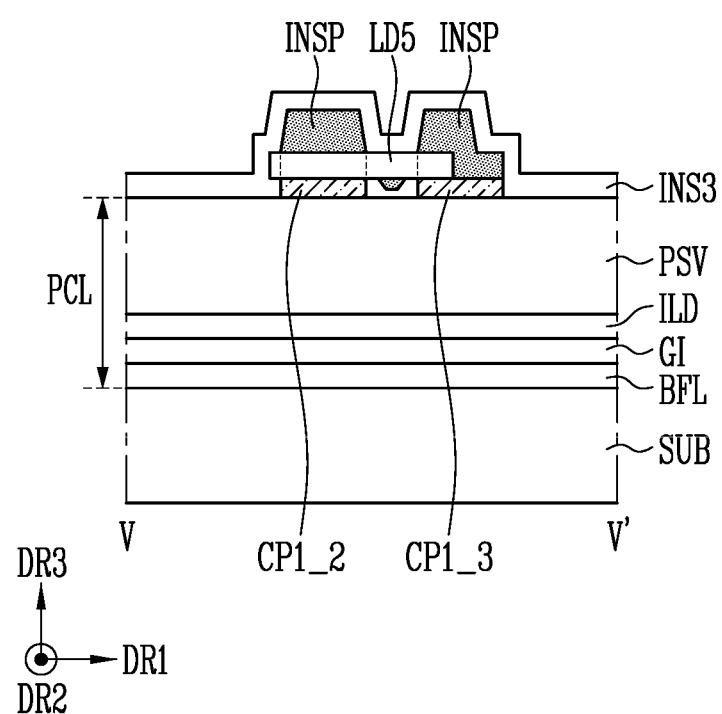
FIGS. 14B and 14C are schematic cross-sectional views taken along the line V~V' of FIG. 12.
Figure 14C:
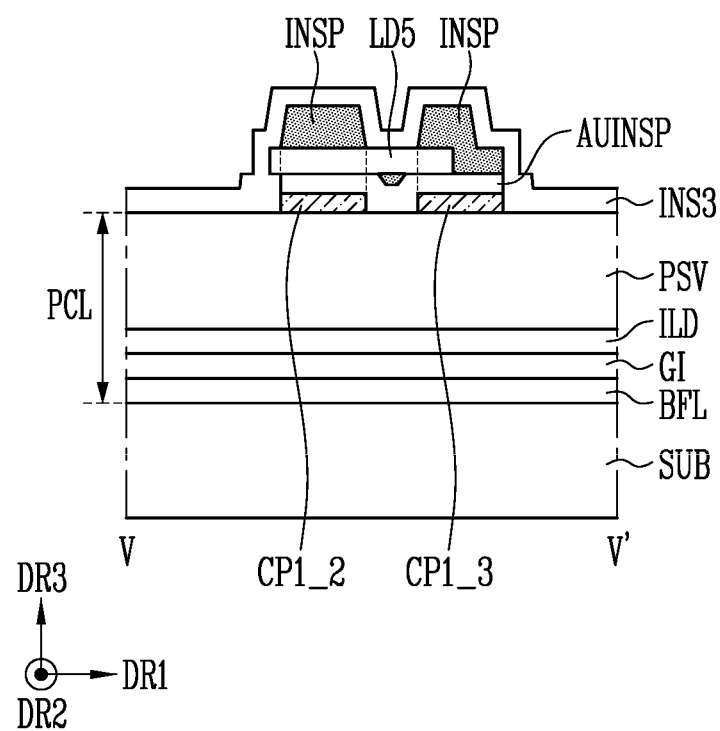

FIG. 12 is a schematic plan view of an enlarged region EA of FIG. 5, FIG. 13A is a schematic plan view illustrating only a dummy conductive pattern, the (4-1)th electrode EL4_1, and the (4-2)th electrode EL4_2 of FIG. 12, FIG. 13B is a schematic plan view illustrating only the second insulating layer and the dummy insulating pattern of FIG. 12, FIG. 14A is a schematic cross-sectional view taken along the line IV~IV' of FIG. 12, and FIGS. 14B and 14C are schematic cross-sectional views taken along the line V~V' of FIG. 12.

A point different from that of the above-described embodiment is mainly described to avoid a description repetitive to that of the above-described embodiment.

Referring to FIGS. 5 and 12-14C, at least one fifth light emitting element LD5 and the dummy pattern DMP overlapping the fifth light emitting element LD5 may be disposed in the first opening OP1 of the bank BNK.

When an alignment signal (or an alignment voltage) corresponding to each of the first to fourth electrodes EL1 to EL4 is applied to the fifth light emitting element LD5 and an electric field is formed between two adjacent electrodes, the above-described fifth light emitting element LD5 may be a defective light emitting device that is not aligned between the two electrodes, is aligned in an undesired area and is not electrically connected to the two electrodes.

The dummy pattern DMP may be provided in the first opening OP1 of the bank BNK and may overlap the fifth light emitting element LD5. On the plan view, the dummy pattern DMP may be provided between the (1-1)th electrode EL1_1 and the (1-2)th electrode EL1_2 that are spaced from each other and face each other in the second direction DR2. In a plan view, the dummy pattern DMP may be provided between the (4-1)th electrode EL4_1 and the (4-2)th electrode EL4_2 that are spaced from each other and face each other in the second direction DR2. In an embodiment, the dummy pattern DMP may be a fixing member that fixes the fifth light emitting element LD5 so that the fifth light emitting element LD5 is not deviated from an aligned position.

The dummy pattern DMP may include a dummy conductive pattern CP and a dummy insulating pattern INSP.

The dummy conductive pattern CP may be connected to each of the first and fourth electrodes EL1 and EL4. For example, the dummy conductive pattern CP may be connected to one end (for example, the protrusion PRT) of the (1-1)th electrode EL1_1, may be connected to one end (for example, the protrusion PRT) of the (1-2)th electrode EL1_2, may be connected to one end (for example, the protrusion PRT) of the (4-1)th electrode EL4_1, and may be connected to one end (for example, the protrusion PRT) of the (4-2)th electrode EL4_2. The dummy conductive pattern CP connected to the protrusion PRT of each of the first and fourth electrodes EL1 and EL4 may be spaced from the dummy conductive pattern CP connected to the protrusion PRT of the electrode adjacent in the second direction DR2. For example, the dummy conductive pattern CP connected to the protrusion PRT of the (1-1)th electrode EL1_1 may be spaced from the dummy conductive pattern CP connected to the protrusion PRT of the (1-2)th electrode EL1_2. The dummy conductive pattern CP connected to the protrusion PRT of the (4-1)th electrode EL4_1 may be spaced from the dummy conductive pattern CP connected to the protrusion PRT of the (4-2)th electrode EL4_2.

The dummy conductive pattern CP connected to the (1-1)th electrode EL1_1 and the dummy conductive pattern CP connected to the (4-1)th electrode EL4_1 may have substantially similar or identical structures. Accordingly, a description of the dummy conductive pattern CP connected to the (1-1)th electrode EL1_1 is replaced with a description of the dummy conductive pattern CP connected to the (4-1)th electrode EL4_1. Similarly, the dummy conductive pattern CP connected to the (1-2)th electrode EL1_2 and the dummy conductive pattern CP connected to the (4-2)th electrode EL4_2 may have substantially similar or identical structures. Accordingly, a description of the dummy conductive pattern CP connected to the (1-2)th electrode EL1_2 is replaced with a description of the dummy conductive pattern CP connected to the (4-2)th electrode EL4_2.

The dummy insulating pattern INSP may be provided on the conductive pattern CP connected to each of the (4-1)th and (4-2)th electrodes EL4_1 and EL4_2 between the (4-1)th electrode EL4_1 and the (4-2)th electrode EL4_2 facing each other in the second direction DR2. The dummy conductive pattern CP and the dummy insulating pattern INSP described above may configure the dummy pattern DMP.

The dummy conductive pattern CP may be provided and/or formed on the passivation layer PSV. The dummy conductive pattern CP may be provided at the same layer as the first to fourth electrodes EL1 to EL4. The dummy conductive pattern CP connected to the (4-1)th electrode EL4_1 may be provided integrally with the (4-1)th electrode EL4_1, and the dummy conductive pattern CP connected to the (4-2)th electrode EL4_2 may be provided integrally with the (4-2)th electrode EL4_2. Hereinafter, for convenience of description, the dummy conductive pattern CP provided integrally with the (4-1)th electrode EL4_1 is referred to as a first dummy conductive pattern CP1, and the dummy conductive pattern CP provided integrally with the (4-2)th electrode EL4_2 is referred to as a second dummy conductive pattern CP2.

The first dummy conductive pattern CP1 may include at least one or more dummy conductive patterns. For example, the first dummy conductive pattern CP1 may include (1-1)th to (1-5)th dummy conductive patterns CP1_1 to CP1_5. The (1-1)th to (1-5)th dummy conductive patterns CP1_1 to CP1_5 may be branched from the (4-1)th electrode EL4_1 in the second direction DR2. Each of the (1-1)th to (1-5)th dummy conductive patterns CP1_1 to CP1_5 may be spaced from the dummy conductive pattern adjacent in the first direction DR1 at an interval d1 (e.g., a set or predetermined interval d1) (hereinafter, referred to as a "first interval d1"). At this time, the first dummy conductive pattern CP1 may be formed so that the first interval d1 corresponds within a range less than the diameter D and/or the length L of the fifth light emitting element LD5. However, the disclosure is not limited thereto, and according to an embodiment, the first dummy conductive pattern CP1 may be formed so that the first interval d1 is greater than the diameter D and/or the length L of the fifth light emitting element LD5.

The second dummy conductive pattern CP2 may include at least one or more dummy conductive patterns. For example, the second dummy conductive pattern CP2 may include (2-1)th to (2-5)th dummy conductive patterns CP2_1 to CP2_5. The (2-1)th to (2-5)th dummy conductive patterns CP2_1 to CP2_5 may be branched from the (4-2)th electrode EL4_2 in the second direction DR2. Each of the (2-1)th to (2-5)th dummy conductive patterns CP2_1 to CP2_5 may be spaced from the dummy conductive pattern adjacent in the first direction DR1 at an interval (e.g., a set or predetermined interval). At this time, the interval (e.g., a set or predetermined interval) may be the same as the first interval d1.

The first dummy conductive pattern CP1 and the second dummy conductive pattern CP2 may be positioned in the same column and be spaced from each other. For example, the (1-1)th dummy conductive pattern CP1_1 and the (2-1)th dummy conductive pattern CP2_1 may be positioned in the same column and be spaced from each other, the (1-2)th dummy conductive pattern CP1_2 and the (2-2)th dummy conductive pattern CP2_2 may be positioned in the same column and be spaced from each other, the (1-3)th dummy conductive pattern CP1_3 and the (2-3)th dummy conductive pattern CP2_3 may be positioned in the same column and be spaced from each other, the (1-4)th dummy conductive pattern CP1_4 and the (2-4)th dummy conductive pattern CP2_4 may be positioned in the same column and be spaced from each other, and the (1-5)th dummy conductive pattern CP1_5 and the (2-5)th dummy conductive pattern CP2_5 may be positioned in the same column and be spaced from each other.

As described above, the first dummy conductive pattern CP1 and the second dummy conductive pattern CP2 may be spaced from each other between the (4-1)th electrode EL4_1 and the (4-2)th electrode EL4_2 to be electrically and/or physically separated from each other. Accordingly, the (4-1)th electrode EL4_1 provided integrally with the first dummy conductive pattern CP1 and the (4-2)th electrode EL4_2 provided integrally with the second dummy conductive pattern CP2 may maintain a state in which the (4-1)th electrode EL4_1 provided integrally with the first dummy conductive pattern CP1 and the (4-2)th electrode EL4_2 provided integrally with the second dummy conductive pattern CP2 are electrically and/or physically separated from each other.

The dummy insulating pattern INSP may be provided and/or formed on the dummy conductive pattern CP. In an embodiment, the dummy insulating pattern INSP may be positioned between the (4-1)th electrode EL4_1 and the (4-2)th electrode EL4_2 facing each other in the second direction DR2. The dummy insulating pattern INSP may be provided and/or formed on each of the first and second dummy conductive patterns CP1 and CP2. The dummy insulating pattern INSP may be configured of an inorganic insulating layer including an inorganic material or an organic insulating layer including an organic material. In an embodiment of the disclosure, the dummy insulating pattern INSP may be provided at the same layer as the second insulating layer INS2 and may include the same material as the second insulating layer INS2.

In an embodiment, the dummy insulating pattern INSP may be provided integrally with the second insulating layer INS2. For example, the dummy insulating pattern INSP may be provided in a form extending from the second insulating layer INS2 on the fourth light emitting elements LD4 to the first opening OP1 of the bank BNK corresponding to an area between the (4-1)th electrode EL4_1 and the (4-2)th electrode EL4_2. In an embodiment, the dummy insulating pattern INPS may be provided in a form extending from the second insulating layer INS2 on the third light emitting elements LD3 to the first opening OP1 of the bank BNK corresponding to an area between the (4-1)th electrode EL4_1 and the (4-2)th electrode EL4_2. At this time, the dummy insulating pattern INSP extending from the second insulating layer INS2 on the fourth light emitting elements LD4 may be spaced from the dummy insulating pattern INSP extending from the second insulating layer INS2 on the third light emitting elements LD3. According to an embodiment, the dummy insulating pattern INSP may be spaced from the second insulating layer INS2 on the fourth light emitting elements LD4 and may be provided in the first opening OP1 of the bank BNK. In an embodiment, the dummy insulating pattern INSP may be spaced from the second insulating layer INS2 on the third light emitting elements LD3 and may be provided in the first opening OP1 of the bank BNK. In such a case, the dummy insulating pattern INSP extending from the second insulating layer INS2 on the fourth light emitting elements LD4 may be spaced from the dummy insulating pattern INSP extending from the second insulating layer INS2 on the third light emitting elements LD3.

When the second insulating layer INS2 is provided and/or formed on each of the third and fourth light emitting elements LD3 and LD4, the dummy insulating pattern INSP may be provided and/or formed in the first opening OP1 of the bank BNK concurrently (or simultaneously). At this time, the dummy insulating pattern INSP may be disposed in the first opening OP1 so as to be spaced from the second insulating layer INS2 positioned around the first opening OP1 of the bank BNK at an interval d3 (e.g., a set or predetermined interval d3 (or distance d3)).

In an embodiment of the disclosure, the dummy insulating pattern INSP may be provided and/or formed on the fifth light emitting element LD5 positioned in the first opening OP1 of the bank BNK, and may function as a fixing member that fixes the fifth light emitting element LD5. In other words, the dummy insulating pattern INSP may be formed on the fifth light emitting element LD5 to fix the fifth light emitting element LD5 so that the fifth light emitting element LD5 is not deviated from the aligned position.

The dummy insulating pattern INSP may overlap the dummy conductive pattern CP in a plan view. For example, the dummy insulating pattern INSP may have the same planar shape as the dummy conductive pattern CP. For example, when the dummy insulating pattern INSP has a planar shape of a bar shape extending in the second direction DR2, the dummy conductive pattern CP provided under the dummy insulating pattern INSP may also have a planar shape corresponding thereto. The dummy insulating pattern INSP provided on the first dummy conductive pattern CP1 may be spaced from the dummy insulating pattern INSP provided on the second dummy conductive pattern CP2. When the dummy insulating pattern INSP and the dummy conductive pattern CP have the same planar shape, a width W of the dummy insulating pattern INSP in the first direction DR1 and a width W of the dummy conductive pattern CP in the first direction DR1 may be the same.

The dummy conductive pattern CP may be formed in a process of forming the dummy insulating pattern INSP. The dummy insulating pattern INSP may be used as an etching mask of the dummy conductive pattern CP. A manufacturing process of the dummy insulating pattern INSP and the dummy conductive pattern CP is described later with reference to FIGS. 15A-15C.

An insulating layer may not be provided between the dummy insulating pattern INSP and the dummy conductive pattern CP. For example, as shown in FIGS. 14A and 14B, the dummy insulating pattern INSP may be directly disposed on the dummy conductive pattern CP to contact the dummy conductive pattern CP. However, the disclosure is not limited thereto. According to an embodiment, an auxiliary insulating pattern AUINSP may be positioned between the dummy insulating pattern INSP and the dummy conductive pattern CP as shown in FIG. 14C. The auxiliary insulating pattern AUINSP may include the same material as the first insulating layer INS1. The auxiliary insulating pattern AUINSP may be formed concurrently (or simultaneously) when the dummy pattern DMP is formed in the first opening OP1 of the bank BNK.

The dummy insulating pattern INSP configuring the dummy pattern DMP together with the dummy conductive pattern CP may be provided on the fifth light emitting element LD5 between the (4-1)th electrode EL4_1 and the (4-2)th electrode EL4_2 corresponding to the first opening OP1 of the bank BNK to prevent the fifth light emitting element LD5 from being deviated.

As described above, the fifth light emitting element LD5 may be the defective light emitting element that is not positioned between two adjacent electrodes and not connected to the two adjacent electrodes, for example, the fifth light emitting element LD5 may be a misaligned light emitting element. When the fifth light emitting element LD5 remains in the pixel area PXA of each pixel PXL, the fifth light emitting element LD5 may be deviated from the aligned position when performing a subsequent process. The fifth light emitting element LD5 deviated from the aligned position may be recognized as a foreign material, may cause a defect determination when performing an inspection process or the like, and may reduce a product yield of the display device. Further, the deviated fifth light emitting element LD5 may cause contamination of equipment to which a corresponding process is applied when performing a subsequent process.

Accordingly, in an embodiment of the disclosure, the fifth light emitting element LD5, which is the defective light emitting element (or the misaligned light emitting element), may be fixed by disposing the dummy insulating pattern INSP in the first opening OP1 of the bank BNK, thereby preventing the fifth light emitting element LD5 from being deviated. Even though the fifth light emitting element LD5 remains in the pixel area PXA of each pixel PXL, the dummy insulating pattern INSP formed on the fifth light emitting element LD5 may sufficiently fix the fifth light emitting element LD5, thereby preventing the fifth light emitting element LD5 from being deviated. Accordingly, a defect that may occur due to the recognition of the fifth light emitting element LD5 as a foreign material may be reduced. Also, contamination of equipment due to the fifth light emitting element LD5 remaining in the first opening OP1 may be prevented in a subsequent process by stably fixing the fifth light emitting element LD positioned in the first opening OP1 of the bank BNK.

In the above-described embodiment, an embodiment in which the first to fourth electrodes EL1 to EL4 are disposed in the pixel area PXA of each pixel PXL is described, but the disclosure is not limited thereto. According to an embodiment, only two electrodes, each including two sub electrodes, which are spaced from each other in the first direction DR1 and face each other in the second direction DR2, may be disposed in the pixel area PXA. In this case, the dummy pattern DP including the dummy conductive pattern CP and the dummy insulating pattern INSP may be provided to correspond to an area between the two sub electrodes facing in the second direction DR2. At this time, one end of each of the two sub electrodes facing each other may include a protrusion protruding in a direction facing the first opening OP1 of the bank BNK, and the dummy conductive pattern CP of the dummy pattern DP may be branched from the protrusion of a corresponding electrode.

In the above-described embodiment, an embodiment in which the dummy conductive pattern CP is connected to one end of the (4-1)th electrode EL4_1 and one end of the (4-2)th electrode EL4_2 is described, but the disclosure is not limited thereto. According to an embodiment, the dummy conductive pattern CP is not connected to the one end of each of the (4-1)th and (4-2)th electrodes EL4_1 and EL4_2, and may be spaced from the one end of each of the (4-1)th and (4-2)th electrodes EL4_1 and EL4_2. This is described later with reference to FIGS. 16A-16D.

Figure 15A:
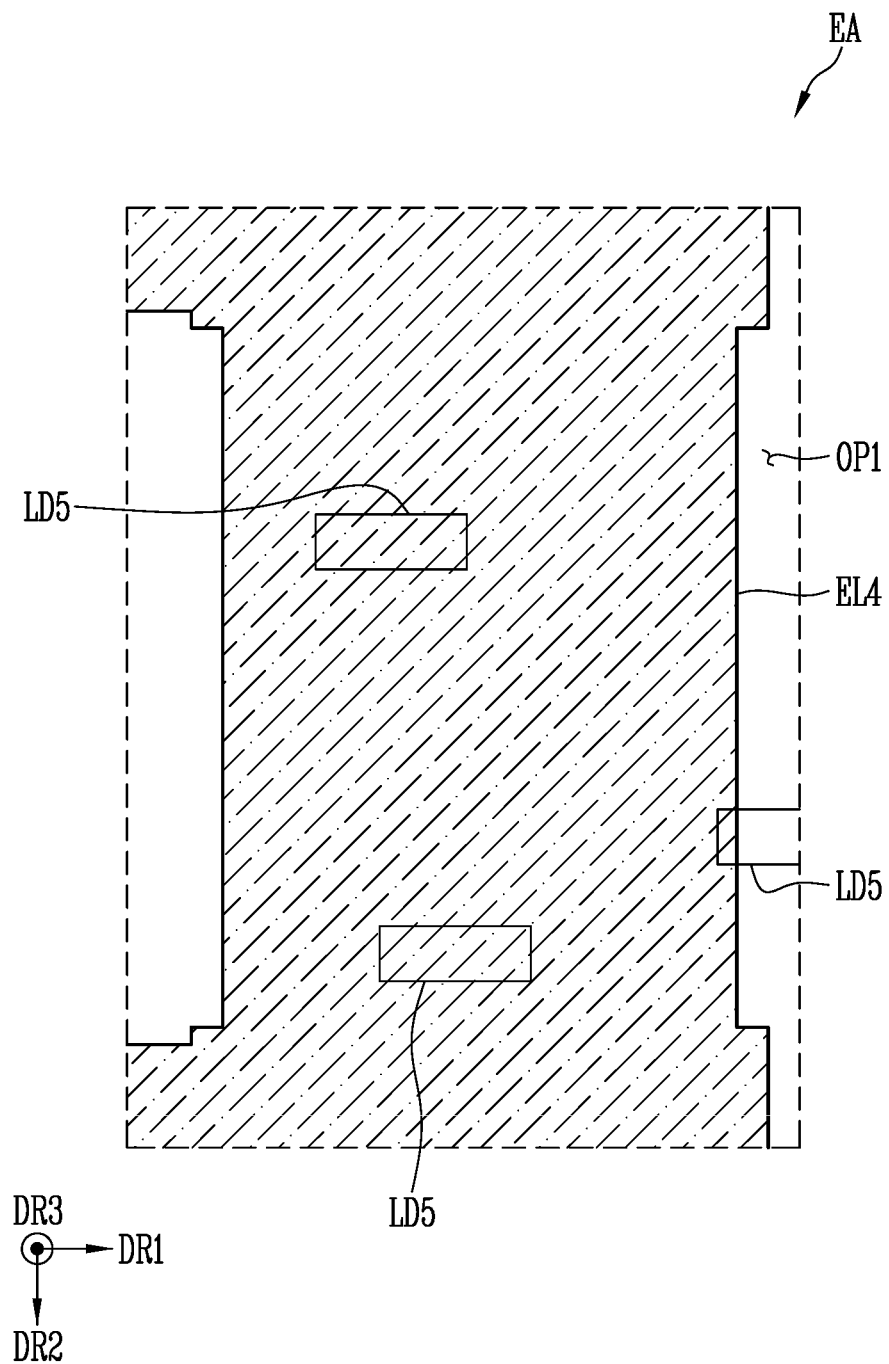
FIGS. 15A-15C are schematic plan views sequentially illustrating a method of manufacturing configurations included in the region EA of FIG. 12.
Figure 15B:
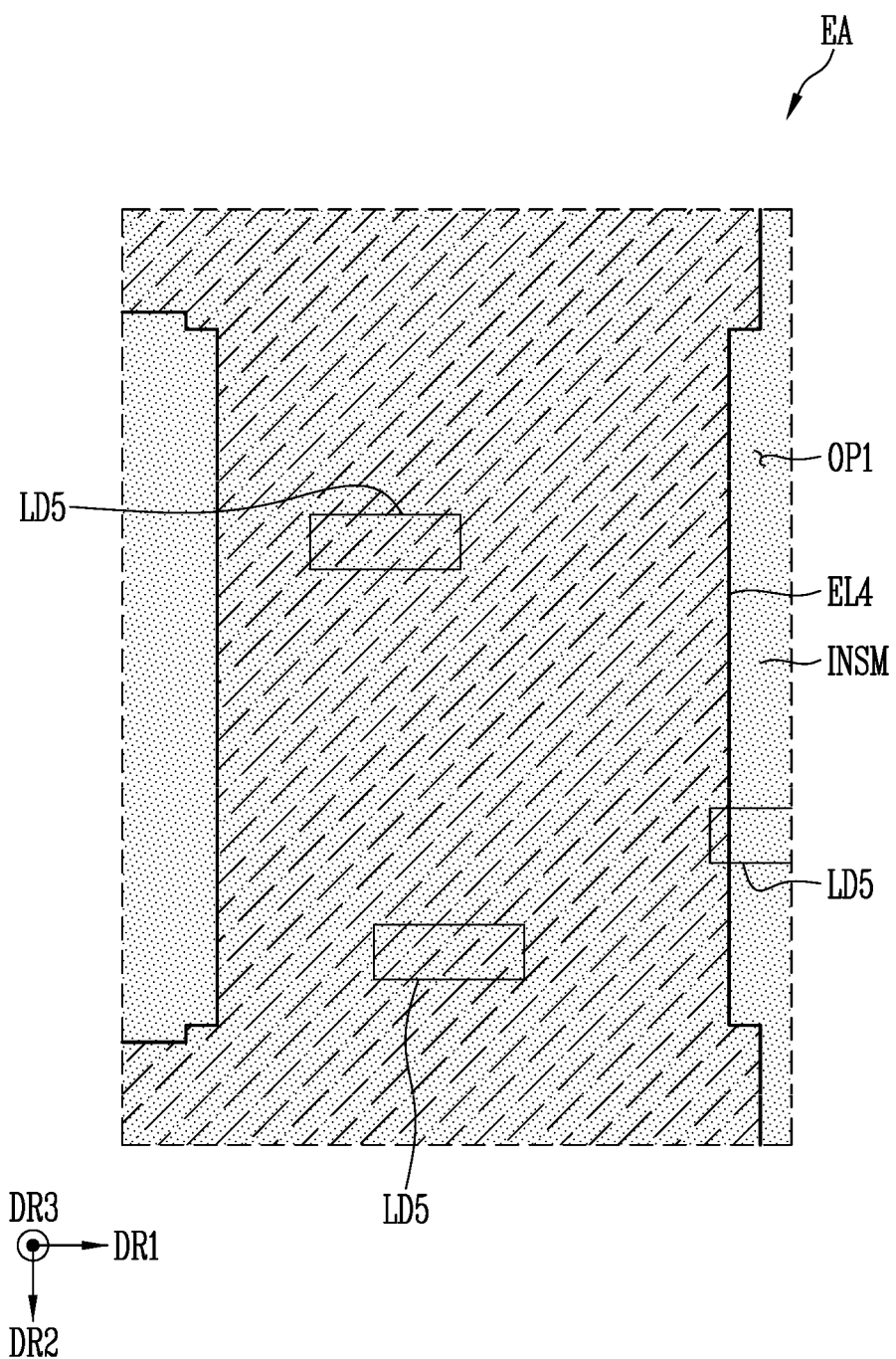
Figure 15C:
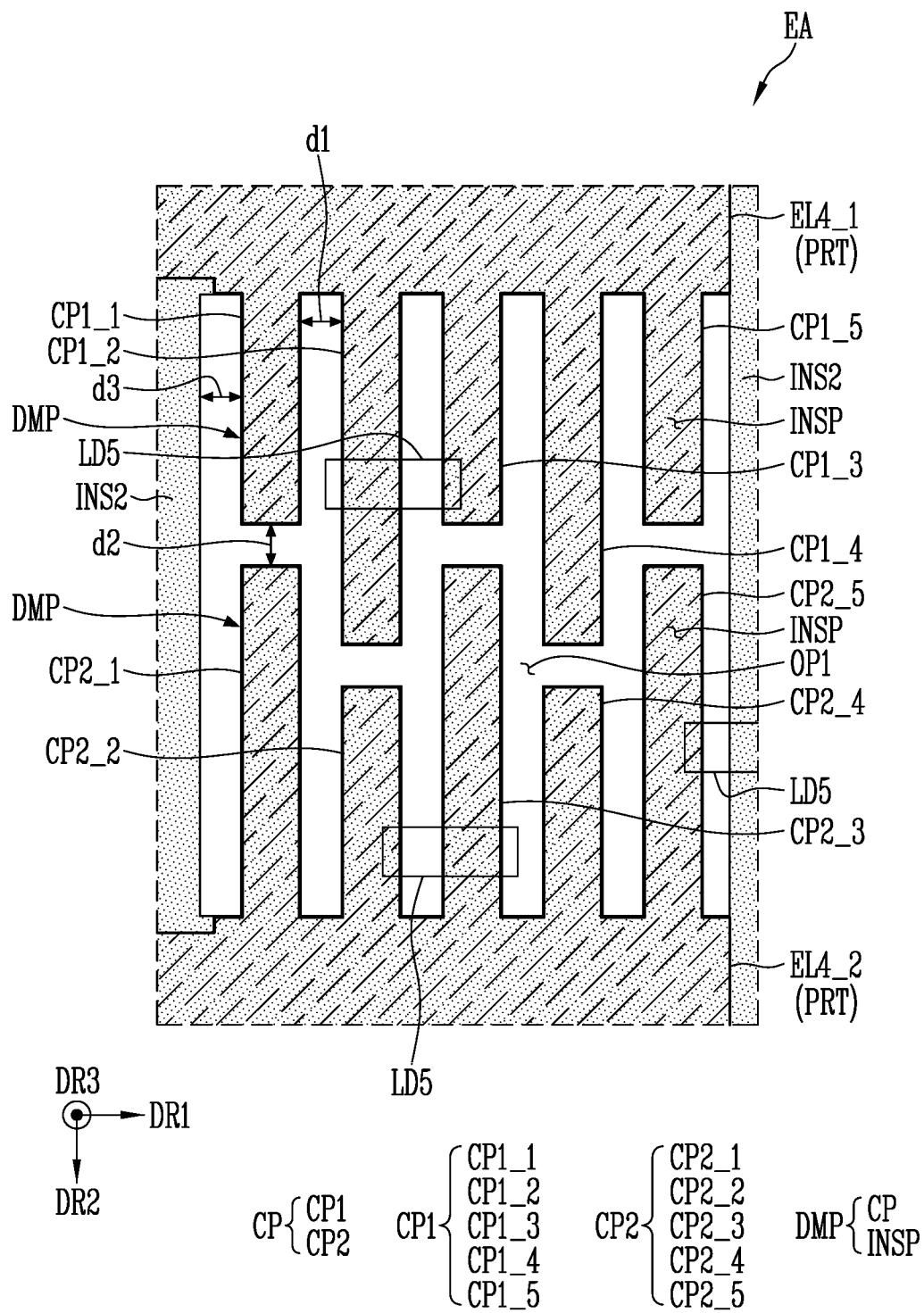

FIGS. 15A-15C are schematic plan views sequentially illustrating a method of manufacturing configurations included in the region EA of FIG. 12. For reference, FIGS. 15A-15C are plan views sequentially illustrating a method of manufacturing configurations positioned in the first opening OP1 of the bank BNK when aligning and fixing the light emitting elements LD in the pixel area PXA of each pixel PXL.

In FIGS. 15A-15C, a point different from that of the above-described embodiment is mainly described in order to avoid a repetitive description.

Referring to FIGS. 12 and 15A, the first to fourth electrodes EL1 to EL4 may be positioned in the first opening OP1 of the bank BNK. In the first opening OP1 of the bank BNK, the first to third electrodes EL1 to EL3 and the fourth electrode EL4 may have substantially similar or identical structures. Accordingly, a description of the first to third electrodes EU to EL3 positioned in the first opening OP1 of the bank BNK is replaced with a description of the fourth electrode EL4.

A portion of the fourth electrode EL4 may not be removed in the pixel area PXA of each pixel PXL, and the fourth electrode EL4 may be provided integrally with the fourth electrode EL4 positioned in the pixels PXL adjacent to a corresponding pixel PXL in the second direction DR2. For example, the fourth electrode EL4 positioned in the pixel area PXA of the corresponding pixel PXL may be connected to the fourth electrode EL4 positioned in each of the pixels PXL adjacent in the second direction DR2.

When the light emitting elements LD are supplied to the pixel area PXA and the alignment signal (or the alignment voltage) corresponding to each of the first to fourth electrodes EU to EL4 is applied, an electric field may be formed between two adjacent electrodes, and the light emitting elements LD may be aligned between the two adjacent electrodes. The light emitting elements LD may be aligned in the emission areas EMA1 and EMA2 of the pixel area PXA. At this time, at least one fifth light emitting element LD5 may be aligned in the first opening OP1 of the bank BNK. The fifth light emitting element LD5 may be the defective light emitting element that is not connected to the two adjacent electrodes. In an embodiment, the fifth light emitting element LD5 may be the misaligned light emitting element aligned in an undesired area, for example, the first opening OP1 of the bank BNK.

Referring to FIGS. 12, 15A, and 15B, an insulating material layer INSM is formed on the fourth electrode EL4. At this time, the first insulating layer INS1 may not be provided on one region of the fourth electrode EL4 corresponding to the first opening OP1 of the bank BNK. Therefore, the insulating material layer INSM may be directly formed on one region of the fourth electrode EL4 corresponding to the first opening OP1 of the bank BNK, and contacts the one region of the fourth electrode EL4. The insulating material layer INSM may be an inorganic insulating layer including an inorganic material or an organic insulating layer including an organic material.

The insulating material layer INSM may be formed on the light emitting elements LD aligned in the emission areas EMA1 and EMA2 of the pixel area PXA.

Referring to FIGS. 12 and 15A-15C, after disposing a mask on the insulating material layer INSM, a series of processes may be sequentially performed to remove a portion of the insulating material layer INSM and form the dummy insulating pattern INSP and the second insulating layer INS2. The dummy insulating pattern INSP may be positioned in the first opening OP1 of the bank BNK, and the second insulating layer INS2 may be positioned around the first and second emission areas EMA1 and EMA2 and the first opening OP1. At this time, the dummy insulating pattern INSP and the second insulating layer INS2 adjacent in the first direction DR1 may be spaced from each other at the interval d3 (e.g., the set or predetermined interval d3).

The dummy insulating pattern INSP may be positioned on one region of the fourth electrode EL4 positioned in the first opening OP1 of the bank BNK. In an embodiment, the dummy insulating pattern INSP may be formed on the fifth light emitting element LD5 positioned in the first opening OP1 to fix the fifth light emitting element LD5 so that the fifth light emitting element LD5 is not deviated from the aligned position.

The second insulating layer INS2 may be positioned on one surface of each of the first and fourth light emitting elements LD1 and LD4 in the first emission area EMA1 to expose both ends of each of the first and fourth light emitting elements LD1 and LD4 to the outside. In an embodiment, the second insulating layer INS2 may be positioned on one surface of each of the second and third light emitting elements LD2 and LD3 in the second emission area EMA2 to expose both ends of each of the second and third light emitting elements LD2 and LD3 to the outside.

In an embodiment, an etching process using the dummy insulating pattern INSP as an etching mask is performed to remove the one region of the fourth electrode EL4 positioned under the dummy insulating pattern INSP to form the dummy conductive pattern CP. The dummy conductive pattern CP formed by the above-described etching process may have the same planar shape as the dummy insulating pattern INSP positioned thereon. In the above-described process, as the dummy insulating pattern INSP is used as the etching mask, the dummy conductive pattern CP may have a shape corresponding to the shape of the dummy insulating pattern INSP.

In the above-described process, the one region of the fourth electrode EL4 corresponding to the first opening OP1 of the bank BNK may be removed, and thus the (4-1)th electrode EL4_1 and the (4-2)th electrode EL4_2 that are positioned in the same column and spaced from each other may be formed. In an embodiment, in the above-described process, one region of the fourth electrode EL4 positioned in a second opening OP2 of the bank BNK may be removed to electrically and/or physically separate the fourth electrode EL4 of the corresponding pixel PXL and the fourth electrode EL4 of each of the pixels PXL adjacent in the second direction DR2 from each other. Accordingly, each pixel PXL may be driven independently (or individually) from adjacent pixels PXL.

As a result, the dummy pattern DMP including the dummy conductive pattern CP and the dummy insulating pattern INSP having the same planar shape may be formed in the first opening OP1 of the bank BNK through the above-described processes. At the same time, the one region of the fourth electrode EL4 corresponding to the first opening OP1 may be removed to form the (4-1)th and (4-2)th electrodes EL4_1 and EL4_2 spaced from each other.

FIGS. 16A-16D are schematic plan views corresponding to the region EA of FIG. 12 as implementation of the dummy pattern of FIG. 12 according to another embodiment.

In FIGS. 16A-16D, for convenience, the dummy conductive pattern CP and the dummy insulating pattern INSP are not completely overlapped, but the disclosure is not limited thereto, and the dummy conductive pattern CP and the dummy insulating pattern INSP substantially completely overlaps and have the same planar shape.

Regarding the dummy patterns of FIGS. 16A-16D, features that are different from that of the above-described embodiment are mainly described in order to avoid a repetitive description. A portion that is not specifically described in the disclosure follows the above-described embodiment, and the same numbers indicate the same components, and similar numbers indicate similar components.

Figure 16A:
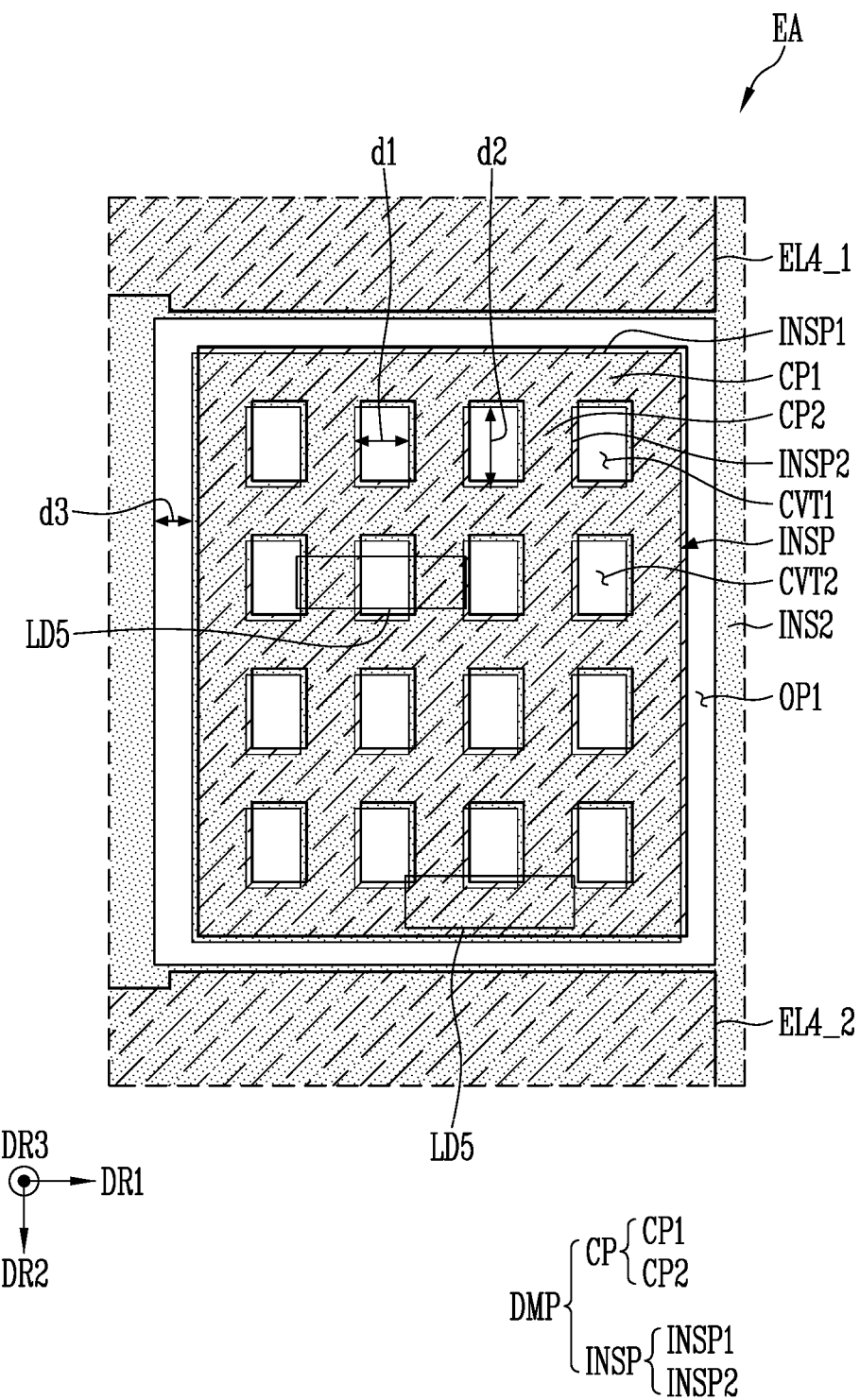
FIGS. 16A-16D are schematic plan views corresponding to the region EA of FIG. 12 as implementation of a dummy pattern of FIG. 12 according to another embodiment.

First, referring to FIGS. 12 and 16A, the dummy pattern DMP may include the dummy conductive pattern CP and the dummy insulating pattern INSP.

The dummy insulating pattern INSP may be positioned in the first opening OP1 to be spaced from the second insulating layer INS2 positioned around the first opening OP1 of the bank BNK at an interval d3 (e.g., a set or predetermined interval (or distance) d3). Here, the second insulating layer INS2 may be the same configuration as the insulating layer INS2 positioned on the first to fourth light emitting elements LD1 to LD4 aligned in the first and second emission areas EMA1 and EMA2 of each pixel PXL.

The dummy insulating pattern INSP may include a plurality of first dummy insulating patterns INSP1 extending in the first direction DR1 and a plurality of second dummy insulating patterns INSP2 extending in the second direction DR2. The dummy insulating pattern INSP may have a mesh structure by the first dummy insulating patterns INSP1 and the second dummy insulating patterns INSP2. The dummy insulating pattern INSP of the mesh structure may include a plurality of first cavities CVT1. Each of the first cavities CVT1 may be an empty space formed by crossing the first dummy insulating patterns INSP1 and the second dummy insulating patterns INSP2. At this time, an interval d1 between two second dummy insulating patterns INSP2 adjacent in the first direction DR1 may be the same as a width of each first cavity CVT1 in the first direction DR1. In addition, an interval d2 between two first dummy insulating patterns INSP1 adjacent in the second direction DR2 may be the same as a width of each first cavity CVT1 in the second direction DR2. Each of the first cavities CVT1 may be designed to have a size (or area) sufficient to prevent the fifth light emitting element LD5 positioned in the first opening OP1 of the bank BNK from being deviated. For example, the size of each first cavity CVT1 may be designed to be less than the diameter D and/or the length L of the fifth light emitting element LD5, but the disclosure is not limited thereto. According to an embodiment, the size of each first cavity CVT1 may be designed to be equal to or greater than the diameter D and/or the length L of the fifth light emitting element LD5.

In an embodiment of the disclosure, the dummy insulating pattern INSP may be a fixing member provided and/formed on the fifth light emitting element LD5 to stably fix the fifth light emitting element LD5.

The dummy conductive pattern CP may be spaced from each of the (4-1)th and (4-2)th electrodes EL4_1 and RL4_2 in the first opening OP1 of the bank BNK. The dummy conductive pattern CP may have the same planar shape as the dummy insulating pattern INSP. For example, the dummy conductive pattern CP may include a first dummy conductive pattern CP1 extending in the first direction DR1, a second dummy conductive pattern CP2 extending in the second direction DR2, and a plurality of second cavities CVT2.

The first dummy conductive pattern CP1 may correspond to the first dummy insulating pattern INSP1, the second dummy conductive pattern CP2 may correspond to the second dummy insulating pattern INSP2, and the second cavities CVT2 may correspond to the first cavities CVT1 of the dummy insulating pattern INSP. Because the dummy conductive pattern CP has the same planar shape as the dummy insulating pattern INSP, the dummy conductive pattern CP may also have a mesh structure.

The dummy pattern DMP including the dummy conductive pattern CP and the dummy insulating pattern INSP described above may have the mesh structure in the first opening OP1 of the bank BNK to stably fix the fifth light emitting element LD5 remaining in the first opening OP1 of the bank BNK, thereby preventing the fifth light emitting element LD5 from being deviated.

As shown in FIGS. 12 and 16B-16D, the dummy pattern DMP may include the dummy insulating pattern INSP and the dummy conductive pattern CP. Here, the dummy insulating pattern INSP and the dummy conductive pattern CP may have the same planar shape.

Figure 16B:
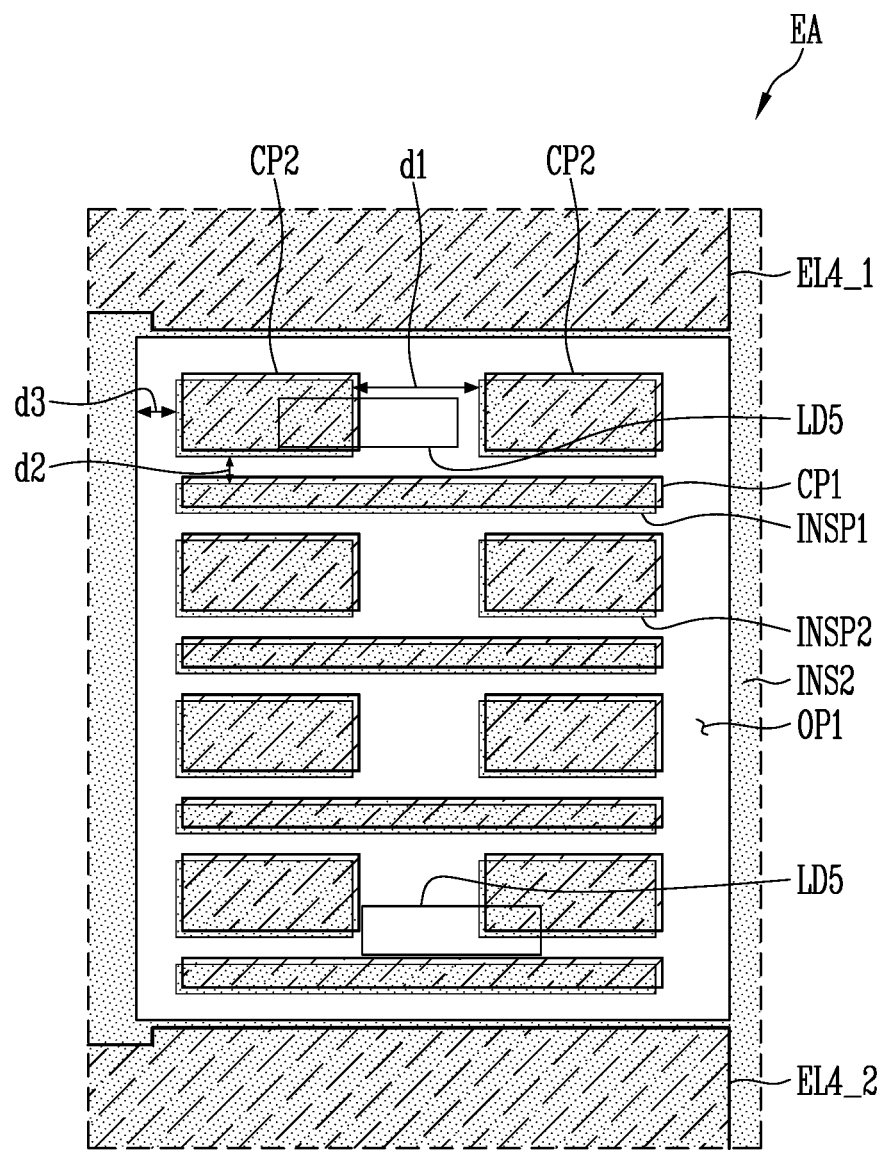
Figure 16C:
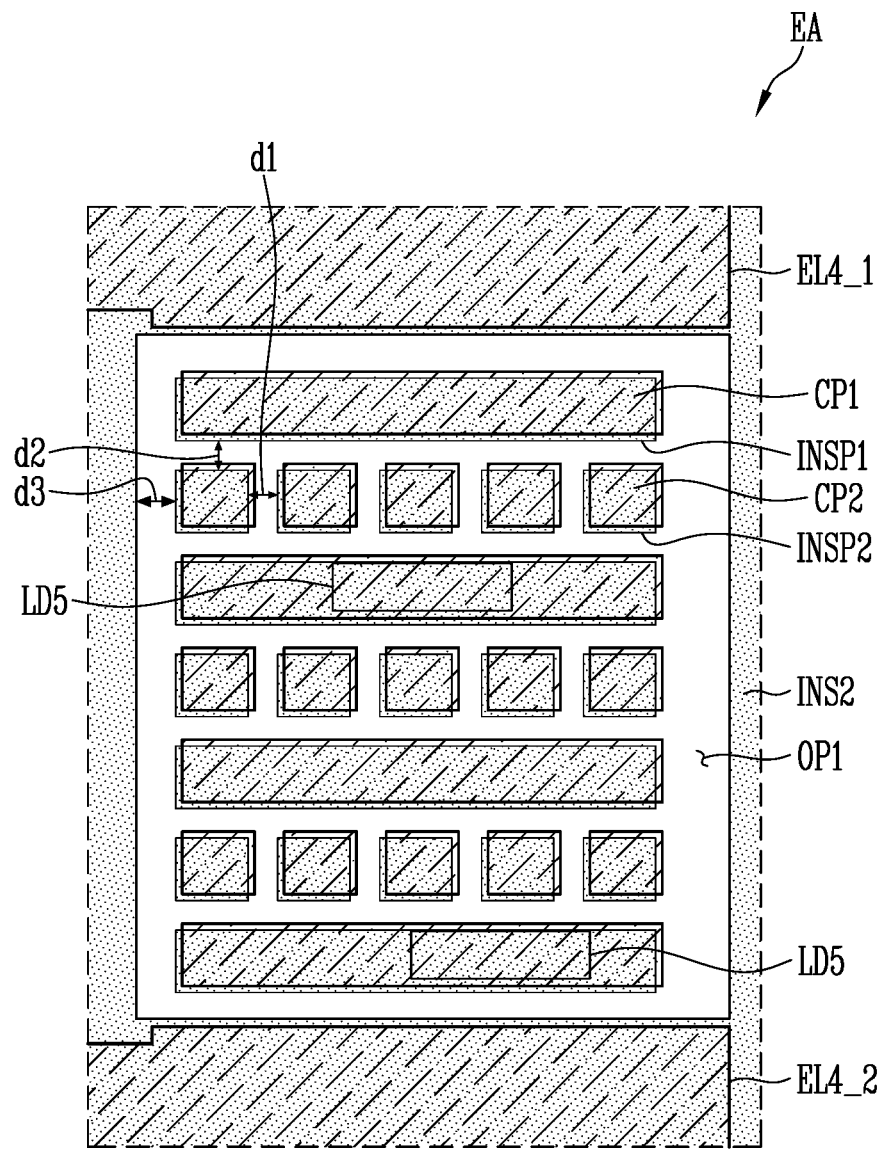

The dummy insulating pattern INSP may include the plurality of first dummy insulating patterns INSP1 extending in the first direction DR1 and the plurality of second dummy insulating patterns INSP2 extending in the second direction DR2 different from the first direction DR1. As shown in FIGS. 16B and 16C, the first dummy insulating patterns INSP1 and the second dummy insulating patterns INSP2 may be positioned in the first opening OP1 of the bank BNK so as to be spaced from each other, but, the disclosure is not limited thereto. According to an embodiment, as shown in FIG. 16D, the first dummy insulating patterns INSP1 and the second dummy insulating patterns INSP2 may be provided in a state in which the first dummy insulating patterns INSP1 and the second dummy insulating patterns INSP2 connected to each other, and the first dummy insulating patterns INSP1 and the second dummy insulating patterns INSP2 may be positioned in the first opening OP1 of the bank BNK.

At this time, as shown in FIGS. 16B and 16C, each of the first dummy insulating patterns INSP1 may be positioned to be spaced from each of the second dummy insulating patterns INSP2 adjacent in the second direction DR2 at the interval d2 (e.g., a set or predetermined interval (or distance) d2). In an embodiment, each of the second dummy insulating patterns INSP2 may be positioned to be spaced from one second dummy insulating pattern INSP2 adjacent in the first direction DR1 at the interval d1 (a set or predetermined interval (or distance) d1). The first and second dummy insulating patterns INSP1 and INSP2 may be designed to adjust the interval therebetween sufficiently to prevent the fifth light emitting element LD5 remaining in the first opening OP1 of the bank BNK from being deviated (or to stably fix the fifth light emitting element LD5).

Figure 16D:
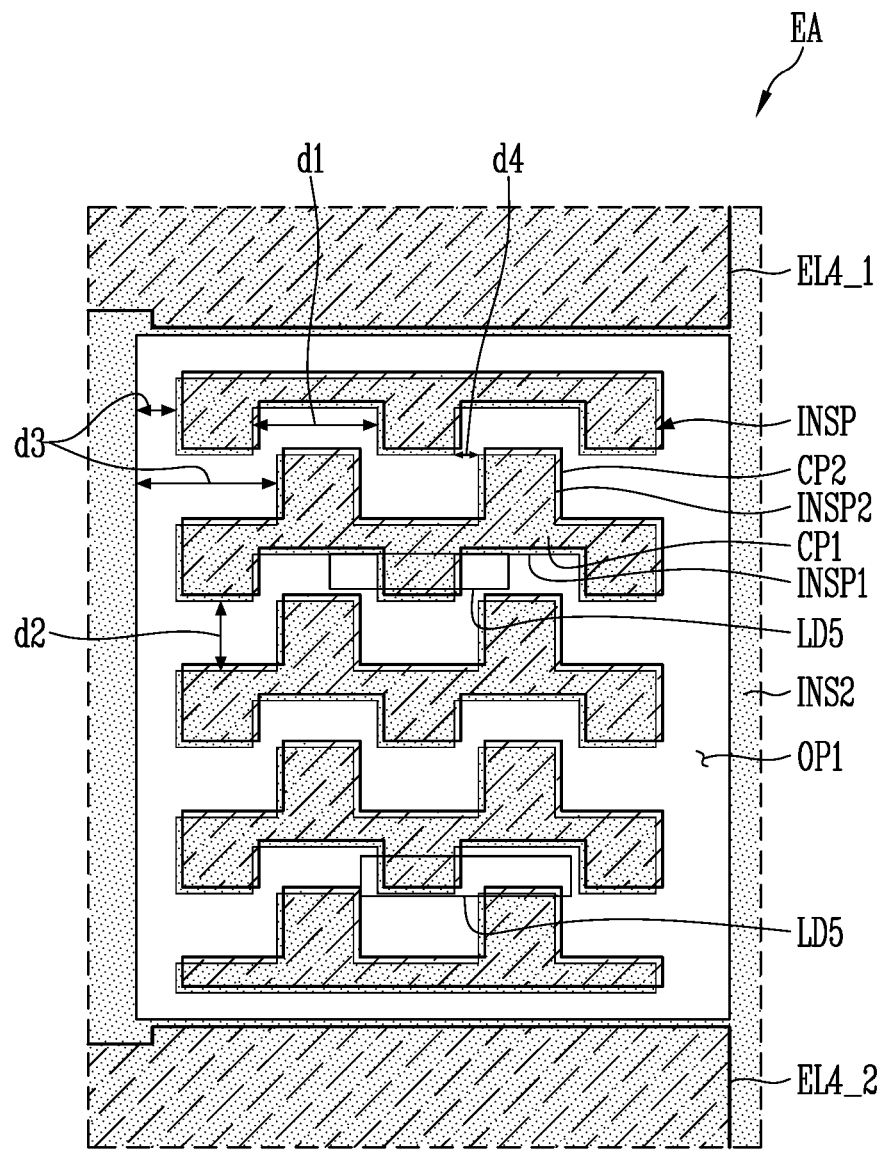

As shown in FIG. 16D, when the first and second dummy insulating patterns INSP1 and INSP2 are connected to each other and provided, some of the second dummy insulating patterns INSP2 may face each other and may include at least one surface positioned on the same line. In such a case, the second dummy insulating patterns INSP2 including at least one surface facing each other and positioned on the same line may be spaced at an interval d4 (e.g., a se or predetermined interval d4). The interval d4 (e.g., the set or predetermined interval d4) may be less than the diameter D of the fifth light emitting element LD5. For example, interval d4 (e.g., the set or the predetermined interval d4) may be 1 μm, but the disclosure is not limited thereto. According to an embodiment, the interval d4 (e.g., the set or predetermined interval d4) may be greater than the diameter D of the fifth light emitting element LD5. The dummy conductive pattern CP may be spaced from each of the (4-1)th and (4-2)th electrodes EL4_1 and EL4_2 in the first opening OP1 of the bank BNK. The dummy conductive pattern CP may have the same planar shape as the dummy insulating pattern INSP. For example, the first dummy conductive pattern CP1 extending in the first direction DR1 and the second dummy conductive pattern CP2 extending in the second direction DR2 may be included.

The first dummy conductive pattern CP1 may correspond to the first dummy insulating pattern INSP1, and the second dummy conductive pattern CP2 may correspond to the second dummy insulating pattern INSP2.

The dummy pattern DMP including the dummy conductive pattern CP and the dummy insulating pattern INSP described above may stably fix the fifth light emitting element LD5 remaining in the first opening OP1 of the bank BNK, thereby preventing the fifth light emitting element LD5 from being deviated. The shape of the dummy insulating pattern INSP is not limited to the above-described embodiments, and may be changed into various shapes within a range capable of sufficiently fixing the fifth light emitting element LD5 remaining in the first opening OP1 of the bank BNK.

Although the disclosure has been described with reference to the embodiments above, those skilled in the art or those having a common knowledge in the art will understand that the disclosure may be various modified and changed without departing from the spirit and technical area of the disclosure described in the claims which will be described later.

Therefore, the technical scope of the disclosure should not be limited to the contents described in the detailed description of the specification, but should be defined by the claims and their equivalents.

What is claimed is:

1. A pixel comprising:
   a substrate;
   an insulating pattern on the substrate;
   a first electrode on the substrate and comprising a (1-1)th electrode and a (1-2)th electrode that are spaced from each other and aligned with each other along a first direction;
   a second electrode spaced from the first electrode in a second direction different from the first direction, and comprising a (2-1)th electrode and a (2-2)th electrode that are spaced from each other and aligned with each other along the first direction;
   a plurality of light emitting elements electrically connected to the first electrode and the second electrode and emitting light; and
   a first insulating layer on each of the light emitting elements,
   wherein the insulating pattern is connected to one end of at least one of the (1-1)th electrode and the (1-2)th electrode that are aligned with each other along the first direction and is located between the (1-1)th electrode and the (1-2)th electrode.

2. The pixel according to claim 1, wherein the insulating pattern and the first insulating layer are located at a same layer and comprise a same material.

3. The pixel according to claim 2, wherein the plurality of light emitting elements comprises:
   at least one first light emitting element positioned between the (1-1)th electrode and the (2-1)th electrode;
   at least one second light emitting element positioned between the (1-2)th electrode and the (2-2)th electrode; and
   at least one ineffective light source positioned between the (1-1)th electrode and the (1-2)th electrode that are aligned with each other along the first direction,
   the first insulating layer on each of the at least one first light emitting element and the at least one second light emitting element, and
   the insulating pattern on the at least one ineffective light source.

4. The pixel according to claim 3, wherein the insulating pattern comprises:
   a first insulating pattern extending from the first insulating layer on the at least one first light emitting element to one end of the (1-1)th electrode; and
   a second insulating pattern extending from the first insulating layer on the at least one second light emitting element to one end of the (1-2)th electrode,
   wherein the first insulating pattern and the second insulating pattern are spaced from each other.

5. The pixel according to claim 3, wherein the insulating pattern comprises:

a first insulating pattern spaced from the first insulating layer on the at least one first light emitting element and positioned between the (1-1)th electrode and the (1-2)th electrode; and a second insulating pattern spaced from the first insulating layer on the at least one second light emitting element and positioned between the (1-1)th electrode and the (1-2)th electrode.

6. The pixel according to claim 3, wherein the insulating pattern comprises:

a plurality of first insulating patterns extending in the first direction; and a plurality of second insulating patterns extending in the second direction different from the first direction.

7. The pixel according to claim 6, wherein the first insulating patterns and the second insulating patterns are connected to each other.

8. The pixel according to claim 7, wherein the insulating pattern further includes a plurality of cavities formed at a crossing between the first insulating patterns and the second insulating patterns.

9. The pixel according to claim 8, wherein the insulating pattern comprises a mesh structure.

10. The pixel according to claim 3, further comprising:

a third electrode spaced from the second electrode in the second direction and comprising a (3-1)th electrode and a (3-2)th electrode that are spaced from each other and aligned with each other along the first direction; and a fourth electrode spaced from the third electrode in the second direction and comprising a (4-1)th electrode and a (4-2)th electrode that are spaced from each other and aligned with each other along the first direction.

11. The pixel according to claim 10, wherein the plurality of light emitting elements comprises:

at least one third light emitting element positioned between the (3-2)th electrode and the (4-2)th electrode; and at least one fourth light emitting element positioned between the (3-1)th electrode and the (4-1)th electrode, wherein the first insulating layer is on each of the at least one third light emitting element and the at least one fourth light emitting element.

12. The pixel according to claim 11, further comprising:

a second insulating layer on the (1-1)th to (4-1)th electrodes and the (1-2)th to (4-2)th electrodes;

a first contact electrode on the (1-1)th electrode and electrically connected to the (1-1)th electrode through a first via hole of the second insulating layer;

a second contact electrode on the (3-1)th electrode and electrically connected to the (3-1)th electrode through a second via hole of the second insulating layer;

a first intermediate electrode on the (2-1)th electrode and the (1-2)th electrode;

a second intermediate electrode on the (2-2)th electrode and the (4-2)th electrode; and a third intermediate electrode on the (3-2)th electrode and the (4-1)th electrode.

13. The pixel according to claim 12, wherein the first intermediate electrode, the second intermediate electrode, and the third intermediate electrode are at a same layer as the first and second contact electrodes, and the first intermediate electrode, the second intermediate electrode, and the third intermediate electrode are spaced from each other.

14. A pixel comprising:

a substrate;

an insulating pattern on the substrate;

a first electrode on the substrate and comprising a (1-1)th electrode and a (1-2)th electrode that are spaced from each other and aligned with each other along a first direction;

a second electrode spaced from the first electrode in a second direction different from the first direction, and comprising a (2-1)th electrode and a (2-2)th electrode that are spaced from each other and aligned with each other along the first direction;

a plurality of light emitting elements electrically connected to the first electrode and the second electrode and emitting light;

a first insulating layer on each of the light emitting elements, and a conductive pattern between the (1-1)th electrode and the (1-2)th electrode that are aligned with each other along the first direction, wherein the insulating pattern is on the conductive pattern, and wherein the insulating pattern is connected to one end of at least one of the (1-1)th electrode and the (1-2)th electrode that are aligned with each other along the first direction or is located between the (1-1)th electrode and the (1-2)th electrode.

15. The pixel according to claim 14, wherein the insulating pattern and the conductive pattern have a same planar shape.

16. The pixel according to claim 15, wherein the conductive pattern comprises:

a first conductive pattern connected to one end of the (1-1)th electrode; and a second conductive pattern connected to one end of the (1-2)th electrode, wherein the first conductive pattern and the second conductive pattern are spaced from each other.

17. The pixel according to claim 15, wherein the conductive pattern is spaced from each of one end of the (1-1)th electrode and one end of the (1-2)th electrode.

18. A display device comprising:

a substrate comprising a plurality of pixel areas; and a pixel located in each of the pixel areas, wherein the pixel comprises:

a first insulating pattern and a second insulating pattern on the substrate;

a first electrode on the substrate and comprising a (1-1)th electrode and a (1-2)th electrode that are spaced from each other and aligned with each other along a first direction;

a second electrode spaced from the first electrode in a second direction different from the first direction, and comprising a (2-1)th electrode and a (2-2)th electrode that are spaced from each other and aligned with each other along the first direction;

a third electrode spaced from the second electrode in the second direction and comprising a (3-1)th electrode and a (3-2)th electrode that are spaced from each other and aligned with each other along the first direction;

a fourth electrode spaced from the third electrode in the second direction and comprising a (4-1)th electrode and a (4-2)th electrode that are spaced from each other and aligned with each other along the first direction;

a plurality of light emitting elements between adjacent two electrodes from among the first to fourth electrodes; and an insulating layer on one surface of each of the light emitting elements, wherein the first insulating pattern is connected to one end of at least one of the (1-1)th electrode and the (1-2)th electrode that are aligned with each other along the first direction and is located between the (1-1)th electrode and the (1-2)th electrode, and the second insulating pattern is connected to one end of at least one of the (4-1)th electrode and the (4-2)th electrode that are aligned with each other along the first direction or is located between the (1-1)th electrode and the (1-2)th electrode.

19. The display device according to claim 18, wherein the plurality of light emitting elements comprises:

first light emitting elements positioned between the (1-1)th electrode and the (2-1)th electrode;

second light emitting elements positioned between the (1-2)th electrode and the (2-2)th electrode;

third light emitting elements positioned between the (3-2)th electrode and the (4-2)th electrode;

fourth light emitting elements positioned between the (3-1)th electrode and the (4-1)th electrode; and at least one fifth light emitting element located between the (1-1)th electrode and the (1-2)th electrode that are aligned with each other along the first direction and between the (4-1)th electrode and the (4-2)th electrode that are aligned with each other along the first direction, the insulating layer is on each of the first to fourth light emitting elements, and the first and second insulating patterns are on the fifth light emitting element.

20. The display device according to claim 19, wherein the insulating layer, the first insulating pattern, and the second insulating pattern are located at a same layer and comprise a same material.

\* \* \* \* \*